(12) United States Patent
Kim et al.

(10) Patent No.: US 11,437,605 B2
(45) Date of Patent: Sep. 6, 2022

(54) LIGHT EMITTING DISPLAY APPARATUS

(71) Applicant: LG DISPLAY CO., LTD., Seoul (KR)

(72) Inventors: YongCheol Kim, Goyang-si (KR);
Wonhoe Koo, Goyang-si (KR);
Dongmin Sim, Gimpo-si (KR);
Kyunghoon Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 163 days.

(21) Appl. No.: 16/883,573

(22) Filed: May 26, 2020

(65) Prior Publication Data
US 2020/0373520 A1    Nov. 26, 2020

(30) Foreign Application Priority Data

May 24, 2019 (KR) .......................... 10-2019-0061481

(51) Int. Cl.
*H01L 51/52* (2006.01)
*H01L 27/32* (2006.01)

(52) U.S. Cl.
CPC ...... *H01L 51/5271* (2013.01); *H01L 27/3246* (2013.01); *H01L 51/5253* (2013.01); *H01L 27/3248* (2013.01); *H01L 2251/5315* (2013.01)

(58) Field of Classification Search
CPC ... H01L 51/5271; H01L 51/5253–5256; H01L 27/3246; H01L 2251/5315; H01L 2933/0091
See application file for complete search history.

(56) References Cited

U.S. PATENT DOCUMENTS

| | | | | |
|---|---|---|---|---|
| 2010/0176717 A1* | 7/2010 | Lee | ...................... | H01L 51/5271 313/504 |
| 2015/0048318 A1* | 2/2015 | Kim | ...................... | H01L 27/326 257/40 |
| 2016/0149154 A1* | 5/2016 | Park | ...................... | H01L 51/5271 257/40 |
| 2017/0084676 A1* | 3/2017 | Jang | ...................... | H01L 51/5225 |
| 2017/0243932 A1* | 8/2017 | Ohara | ................. | H01L 51/5012 |
| 2017/0294493 A1* | 10/2017 | Yoo | ...................... | H01L 27/3218 |
| 2018/0211979 A1* | 7/2018 | Lee | ...................... | H01L 51/5209 |
| 2020/0136092 A1* | 4/2020 | Kim | ...................... | H01L 51/5281 |

FOREIGN PATENT DOCUMENTS

KR   10-2013-0085195 A   7/2013
KR   10-2017-0123569 A   11/2017

* cited by examiner

*Primary Examiner* — Shaun M Campbell
(74) *Attorney, Agent, or Firm* — Birch, Stewart, Kolasch & Birch, LLP

(57) ABSTRACT

A light emitting display apparatus includes a substrate including a plurality of sub-pixels, each of the plurality of sub-pixels including a light emitting area and a reflective area surrounded by the light emitting area, an overcoating layer on the substrate, a partition at the reflective area on the overcoating layer, a light emitting element at the light emitting area on the overcoating layer, and a reflective part on the partition and formed of a same material as the light emitting element.

17 Claims, 16 Drawing Sheets

LIGHT EMITTING DISPLAY APPARATUS

CROSS-REFERENCE TO RELATED APPLICATIONS

This application claims the benefit of and priority to Korean Patent Application No. 10-2019-0061481 filed on May 24, 2019 in the Republic of Korea, the entirety of which is hereby expressly incorporated herein by reference into the present application.

BACKGROUND

Technical Field

The present disclosure relates to a display apparatus and more particularly, to a light emitting display apparatus capable of improving light extraction efficiency of light emitted from a light emitting element.

Discussion of the Related Art

Recently, as our society advances toward an information-oriented society, the field of display apparatus for visually expressing an electrical information signal has rapidly advanced. Various display apparatus, having excellent performance in terms of thinness, lightness, and low power consumption, are being developed correspondingly.

Among these various display apparatus, a light emitting display apparatus is a self-light emitting display apparatus, and can be manufactured to be light and thin since it does not require a separate light source, unlike a liquid crystal display apparatus having a separate light source. In addition, the light emitting display apparatus has advantages in terms of power consumption due to a low voltage driving, and is excellent in terms of a color implementation, a response speed, a viewing angle, and a contrast ratio (CR). Therefore, light emitting display apparatuses have been studied as the next generation displays.

SUMMARY

A portion of light emitted from a light emitting layer of a light emitting display apparatus travels in a front direction of the light emitting display apparatus and comes out of the light emitting display apparatus. However, another portion of the light emitted from the light emitting layer travels in a lateral direction, rather than the front direction and does not come out of the light emitting display apparatus, so that light extraction efficiency of the light emitting display apparatus can be defective. In addition, light travelling at an angle of incidence smaller than a critical angle, of the light travelling in the lateral direction, can come out of the light emitting display apparatus but is not extracted in the front direction, so that front light extraction efficiency of the light emitting display apparatus can be defective.

The inventors of the present disclosure have recognized limitations in which when some of the light emitted from the light emitting layer of the light emitting display apparatus does not come out of the light emitting display apparatus and is lost therein, or even when some of the light emitted from the light emitting layer is extracted outwardly of the light emitting display apparatus, front light extraction efficiency is lowered. Accordingly, the inventors of the present disclosure have invented an improved and useful light emitting display apparatus having a new structure, capable of improving light extraction efficiency and front light extraction efficiency.

An object to be achieved by the present disclosure is to provide an improved and useful light emitting display apparatus capable of improving light extraction efficiency of light emitted from a light emitting element.

Another aspect of the present disclosure is to provide an improved and useful light emitting display apparatus capable of extracting light emitted from a light emitting element in a front direction of the light emitting display apparatus to thereby improve front light extraction efficiency and brightness.

Another aspect of the present disclosure is to provide an improved and useful light emitting display apparatus capable of minimizing light travelling in a lateral direction of the light emitting display apparatus.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an aspect of the present disclosure, a light emitting display apparatus comprises a substrate including a plurality of sub-pixels, each of the plurality of sub-pixels including a light emitting area and a reflective area surrounded by the light emitting area, an overcoating layer on the substrate, a partition at the reflective area on the overcoating layer, a light emitting element at the light emitting area on the overcoating layer, and a reflective part on the partition and formed of a same material as the light emitting element. Thus, the reflective area for reflecting light to an upper portion of the light emitting display apparatus is disposed, whereby light extraction efficiency and front light extraction efficiency of the light emitting element can be improved, and brightness of the light emitting display apparatus can be improved.

According to another aspect of the present disclosure, a light emitting display apparatus comprises an overcoating layer on a substrate, a partition on the overcoating layer, a light emitting element including a first electrode on the overcoating layer, and a reflective part including a first layer on the partition, the light emitting element is disposed to surround the reflective part, and some of light emitted from the light emitting element is reflected upwardly of the light emitting element by the reflective part to extract light to be lost laterally of the light emitting element.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an embodiment of the present disclosure, a utilization rate of light emitted from a light emitting element can be enhanced, thereby allowing for improvements in efficiency and power consumption of a light emitting display apparatus.

According to an embodiment of the present disclosure, light emitted from a light emitting element can be extracted as much as possible in a front direction of a light emitting display apparatus, whereby a viewing angle of the light emitting display apparatus can be improved.

According to an embodiment of the present disclosure, light travelling laterally of a light emitting element can be reflected in a front direction of the light emitting display apparatus, whereby light trapped inside a light emitting display apparatus can be reduced and brightness of the light emitting display apparatus can be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
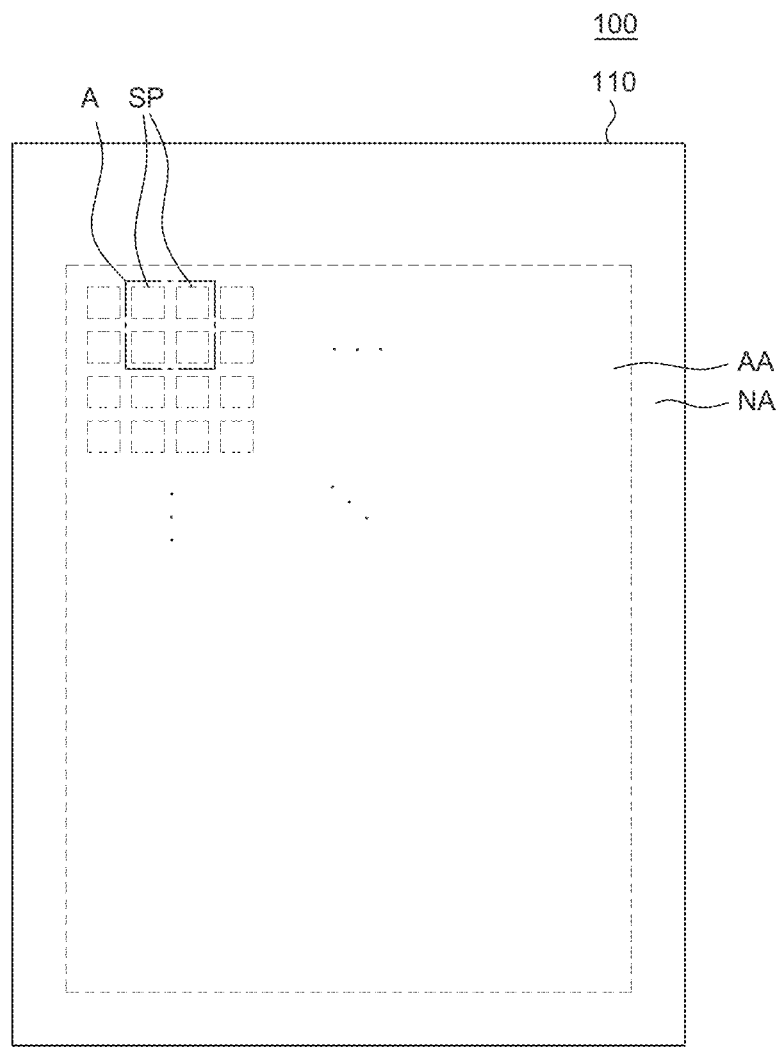
FIG. 1 is a plan view of a light emitting display apparatus according to an exemplary embodiment of the present disclosure.

Advantages and characteristics of the present disclosure and one or more methods of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, one or more other layers or elements can be interposed directly on the other element or therebetween.

Although the terms "first", "second", and the like are used for describing various components, these components are not confined by these terms. These terms are merely used for distinguishing one component from the other components, and may not necessarily define any order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to exemplary embodiments of the present disclosure will be described in detail with reference to accompanying drawings. All the components of the light emitting display apparatus according to all embodiments of the present disclosure are operatively coupled and configured.

FIG. 1 is a plan view of a light emitting display apparatus according to an exemplary embodiment of the present disclosure. FIG. 1 illustrates only a substrate 110 and a plurality of sub-pixels SP among various components of a light emitting display apparatus 100 for convenience of description. However, the light emitting display apparatus includes other components for operation.

With reference to FIG. 1, the substrate 110 is a support member configured to support other components of the light emitting display apparatus 100 and can be formed of an insulating material. For example, the substrate 110 can be formed of glass, resin or the like. In addition, the substrate 110 can be formed of a polymer or plastic such as polyimide (PI) or the like, or can be formed of a material having flexibility.

The substrate 110 includes a display area AA and a non-display area NA.

The display area AA is an area for displaying an image. In the display area AA, the plurality of sub-pixels SP for displaying an image and a circuit unit configured to drive the plurality of sub-pixels SP can be disposed. The circuit unit can include various transistors, capacitors, and wirings for driving the sub-pixels SP. For example, the circuit unit can include various components such as a driving transistor, a switching transistor, a storage capacitor, a gate wiring, and a data wiring, but is not limited thereto.

The non-display area NA is an area where no image is displayed. In the non-display area NA, various wirings, driver ICs or the like configured to drive the sub-pixels SP disposed in the display area AA are disposed. For example, various driver ICs such as a gate driver IC and a data driver IC can be disposed in the non-display area NA.

FIG. 1 illustrates that the non-display area NA surrounds or encloses the display area AA. However, the non-display area NA can be an area extending from one side of the display area AA, but embodiments are not limited thereto.

The plurality of sub-pixels SP are disposed in the display area AA of the substrate 110. Each of the plurality of sub-pixels SP is a separate unit emitting light, and a light emitting element and a driving circuit are formed in each of the plurality of sub-pixels SP. For example, the plurality of sub-pixels SP can include a red sub-pixel, a green sub-pixel, and a blue sub-pixel, but the present disclosure is not limited thereto, and the plurality of sub-pixels SP can further include a white sub-pixel.

Hereinafter, a more detailed description of the plurality of sub-pixels SP is provided with reference to FIGS. 2A and 2B.

Figure 2A:
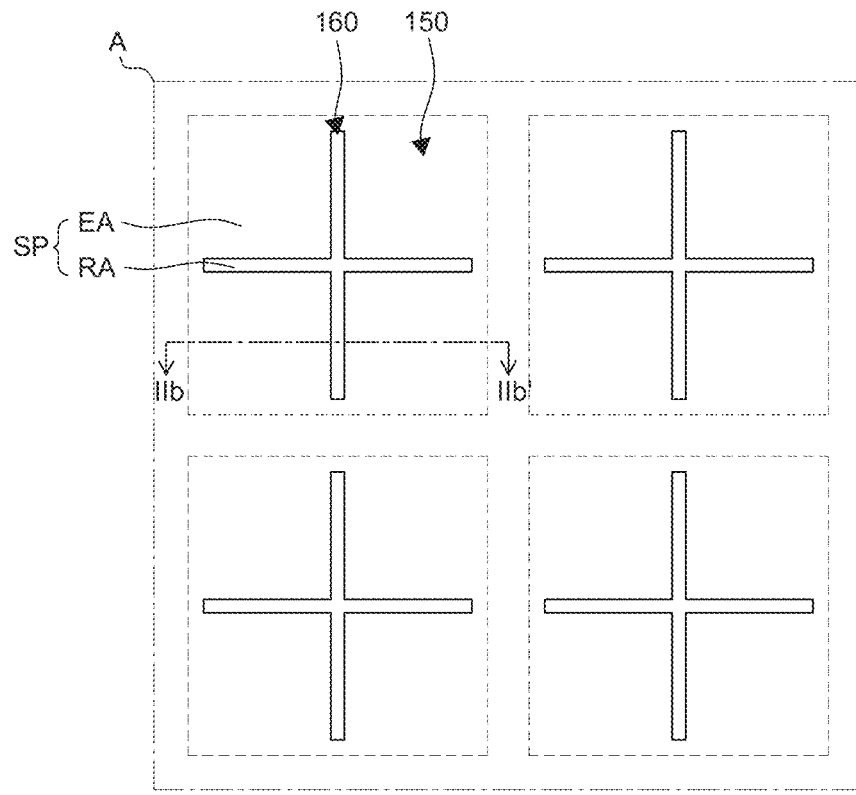
FIG. 2A is an enlarged plan view of region A of FIG. 1.

FIG. 2A is an enlarged plan view of region A of FIG. 1. FIG. 2B is a cross-sectional view taken along line IIb-IIb' of FIG. 2A. In FIG. 2A, only the sub-pixel SP, a reflective area RA, a light emitting area EA, a light emitting element 150, and a reflective part 160 are illustrated for convenience of description.

Figure 2B:
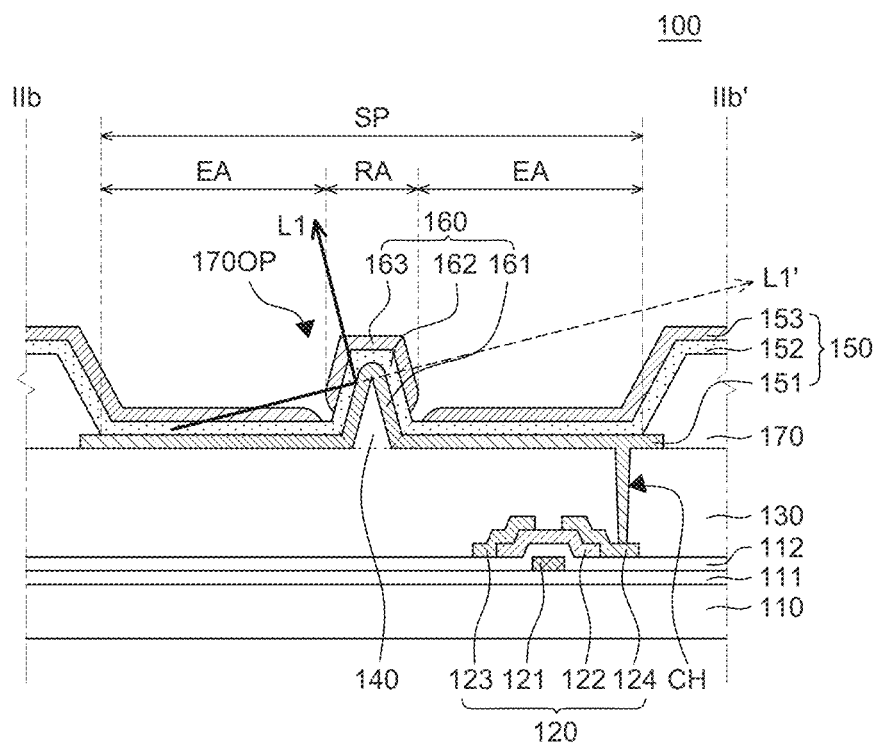
FIG. 2B is a cross-sectional view taken along line IIb-IIb' of FIG. 2A.

With reference to FIGS. 2A and 2B, the light emitting display apparatus 100 according to an exemplary embodiment of the present disclosure can include the substrate 110, a buffer layer 111, a gate insulating layer 112, a thin film transistor 120, an overcoating layer 130, a partition 140, the light emitting element 150, the reflective part 160, and a bank 170.

With reference to FIG. 2A, each of the sub-pixels SP includes the light emitting area EA and the reflective area RA.

The light emitting area EA is an area in which the light emitting element 150 is disposed to emit light. For example, the light emitting area EA can include a red light emitting area, a green light emitting area, a blue light emitting area, and a white light emitting area, but embodiments are not limited thereto and can include one or more different-color light emitting areas.

The reflective area RA is an area in which the reflective part 160 is disposed to reflect light from the light emitting area EA to a front surface of the light emitting display apparatus 100. The reflective area RA can reflect light traveling laterally of the light emitting element 150, in the light emitted from the light emitting element 150, to an upper side of the light emitting display apparatus 100, which is the front surface of the light emitting display apparatus 100.

For example, since the light emitting element 150 is not disposed and only the reflective part 160 is disposed in the reflective area RA, the reflective area RA can be a non-light emitting area that does not emit light, unlike the light emitting area EA. In the plurality of sub-pixels SP, the area of the reflective area RA, which is a non-light emitting area that does not emit light, can be designed in consideration of the area of the light emitting area EA that emits light, and light emission efficiency.

The reflective area RA can be formed to have a shape of an island or open curve. The open curve can be, for example, a curve in which a start point and an end point thereof do not coincide with each other. For example, the reflective area RA can have a cross shape, as shown in FIG. 2A. In addition, the light emitting area EA of one sub-pixel SP may not be separated in plural by the reflective area RA. For example, the light emitting area EA can be disposed to surround the reflective area RA. Therefore, the light emitting area EA may not be separated by the reflective area RA, and the light emitting area EA can be integrally formed in the entirety of the plurality of sub-pixels SP, for example, one sub-pixel SP can include one light emitting area EA.

With reference to FIG. 2B, the buffer layer 111 is disposed on the substrate 110. The buffer layer 111 can prevent diffusion of moisture and/or oxygen penetrated from the outside of the substrate 110. The buffer layer 111 can be formed of an inorganic material. For example, the buffer layer 111 can be formed as a single layer or a plurality of layers of silicon oxide (SiOx) or silicon nitride (SiNx), but embodiments are not limited thereto.

The thin film transistor 120 is disposed on the buffer layer 111. The thin film transistor 120 transfers a data voltage to the plurality of sub-pixels SP.

The thin film transistor 120 includes a gate electrode 121, an active layer 122, a source electrode 123, and a drain electrode 124.

The gate electrode 121 is disposed on the buffer layer 111. The gate electrode 121 can be formed of a conductive material, for example, copper (Cu), aluminum (Al), molybdenum (Mo), titanium (Ti), or an alloy thereof, but embodiments are not limited thereto.

The active layer 122 is disposed on the gate electrode 121. The active layer 122 can include an oxide semiconductor, amorphous silicon, polysilicon, or the like.

The gate insulating layer 112 is disposed between the active layer 122 and the gate electrode 121. The gate insulating layer 112, a layer for insulating the gate electrode 121 and the active layer 122 from each other, can be formed of an insulating material. For example, the gate insulating layer 112 can be formed as a single layer or a plurality of layers of silicon oxide (SiOx) or silicon nitride (SiNx), but embodiments are not limited thereto.

The source electrode 123 and the drain electrode 124 electrically connected to the active layer 122 and spaced apart from each other are disposed on the active layer 122. The source electrode 123 and the drain electrode 124 can be formed of a conductive material, for example, copper (Cu), aluminum (Al), molybdenum (Mo), titanium (Ti), or an alloy thereof, but embodiments are not limited thereto.

According to the structure of the thin film transistor 120, an interlayer insulating layer or the like can be further disposed between the gate electrode 121 and the source electrode 123 and the drain electrode 124 to insulate the gate electrode 121 from the source electrode 123 and the drain electrode 124, but embodiments are not limited thereto.

The overcoating layer 130 is disposed on the thin film transistor 120. The overcoating layer 130 can planarize an upper portion of the substrate 110 on which the thin film transistor 120 is disposed. The overcoating layer 130 includes a contact hole CH for electrically connecting the thin film transistor 120 and the light emitting element 150 to each other. The overcoating layer 130 can be disposed in the display area AA, and the overcoating layer 130 may not be disposed in the entirety of the non-display area NA or may not be disposed in a portion of the non-display area NA.

The overcoating layer 130 can be composed of a single layer or a plurality of layers and can be formed of an organic material. For example, the overcoating layer 130 can be formed of an acrylic-based organic material, but embodiments are not limited thereto.

The partition 140 is disposed in the reflective area RA on the overcoating layer 130. A cross-sectional shape of the partition 140 can be tapered. For example, a cross-sectional area of the partition 140 in a horizontal direction can increase as the partition 140 approaches the overcoating layer 130.

The partition 140 can be formed to protrude from the overcoating layer 130. For example, the partition 140 can be integrally formed with the overcoating layer 130. In FIG. 2B, the partition 140 is illustrated as being integrally formed with the overcoating layer 130, but embodiments are not limited thereto. For example, the partition 140 can be configured separately from the overcoating layer 130.

The light emitting element 150 is disposed on the overcoating layer 130. The light emitting element 150, a self-light emitting element, can be driven by receiving a voltage from the thin film transistor 120 or the like. The light emitting element 150 includes a first electrode 151, a light emitting layer 152, and a second electrode 153.

The first electrode 151 including a reflective layer is separately disposed for each of the sub-pixels SP on the overcoating layer 130. The first electrode 151 can be electrically connected to the thin film transistor 120 through the contact hole CH formed in the overcoating layer 130. The first electrode 151 can be formed of a conductive material capable of supplying holes to the light emitting layer 152. For example, the first electrode 151 can be formed of a transparent conductive layer formed of tin oxide (TO), indium tin oxide (ITO), indium zinc oxide (IZO), indium tin zinc oxide (ITZO) or the like, and a reflective layer formed of a material having excellent reflectivity such as silver (Ag) or an alloy of silver (Ag alloy), but embodiments are not limited thereto. For example, the first electrode 151 can be formed of a reflective layer disposed on the overcoating layer 130 and a transparent conductive layer disposed on the reflective layer, but embodiments are not limited thereto.

The bank 170 is disposed on the first electrode 151 and the overcoating layer 130. The bank 170 is an insulating layer for distinguishing the sub-pixels SP adjacent to each other. The bank 170 includes an opening portion 1700P for exposing a portion of the first electrode 151. The bank 170 can be an organic insulating material disposed to cover an edge or periphery portion of the first electrode 151. The opening portion 1700P of the bank 170 can correspond to the sub-pixel SP, and the sub-pixel SP can be defined by the bank 170.

The light emitting layer 152 is disposed on the first electrode 151 and the bank 170. The light emitting layer 152 can be configured of a single light emitting layer 152 or can have a structure in which a plurality of light emitting layers 152 emitting light of different colors are stacked. The light emitting layer 152 can further include a hole injection layer, a hole transporting layer, a hole blocking layer, an electron transporting layer, an electron injection layer, an electron blocking layer, or the like. The light emitting layer 152 can be an organic light emitting layer formed of an organic material, but embodiments are not limited thereto. For example, the light emitting layer 152 can be a quantum dot light emitting layer or a micro-LED. In addition, with reference to FIG. 2B, the light emitting layers 152 disposed in each of the sub-pixels SP are illustrated as being formed as a single layer throughout the plurality of sub-pixels SP, but can be separately disposed for each of the sub-pixels SP.

The second electrode 153 is disposed on the light emitting layer 152. The second electrode 153 is formed of a conductive material capable of supplying electrons to the light emitting layer 152. For example, the second electrode 153 can be formed of a transparent conductive oxide such as indium tin oxide (ITO), indium zinc oxide (IZO), indium tin zinc oxide (ITZO), zinc oxide (ZnO), and tin oxide (TO) or an alloy of ytterbium (Yb), but embodiments are not limited thereto. With reference to FIG. 2B, the second electrodes 153 disposed in each of the sub-pixels SP are illustrated as being connected to each other, but embodiments are not limited thereto. For example, similarly to the first electrodes 151, the second electrodes 153 can be separately disposed for each of the sub-pixels SP.

The reflective part 160 is disposed in the reflective area RA on the partition 140. The reflective part 160 can be disposed to cover the partition 140. The partition 140 and the reflective part 160 can be disposed in the opening portion 1700P of the bank 170, and can be spaced apart from the bank 170.

The reflective part 160 can reflect at least a portion of light traveling laterally of the light emitting element 150 to the upper side of the light emitting display apparatus 100. For example, the reflective part 160 can be formed of the same material as the light emitting element 150. For example, the reflective part 160 can include a material same as that of the reflective layer of the first electrode 151 of the light emitting element 150. In addition, some of light emitted from the light emitting element 150 can travel laterally of the light emitting element 150, and the light traveling laterally can include light travelling toward a neighboring sub-pixel SP or light travelling toward the bank 170. At least some of light traveling laterally of the light emitting element 150 can be reflected to the upper side of the light emitting display apparatus 100 by the reflective part 160. Accordingly, some of light emitted from the light emitting element 150 can be reflected to the upper side of the light emitting display apparatus 100 by the reflective part 160 having the same material as the reflective layer of the first electrode 151. And, light lost laterally of the light emitting element 150 can be extracted outwardly of the light emitting display apparatus 100, for example, in the front direction of the light emitting display apparatus 100.

Hereinafter, as shown in FIG. 2B, when the partition 140 and the reflective part 160 are disposed, it is assumed that light traveling laterally of the light emitting element 150 is referred to as first light L1. When the partition 140 and the reflective part 160 are not disposed, it is assumed that light traveling laterally of the light emitting element 150 is referred to as first light L1'.

First, unlike the case illustrated in FIG. 2B, when the partition 140 and the reflective part 160 are not disposed, the first light L1' traveling laterally of the light emitting element 150 continues to move in a lateral direction of the light emitting element 150. Therefore, when the partition 140 and the reflective part 160 are not disposed, the first light L1' traveling in the lateral direction of the light emitting element 150 may not be extracted in the front direction of the light emitting display apparatus 100 and can be lost within the light emitting display apparatus 100.

On the other hand, as shown in FIG. 2B, when the partition 140 and the reflective part 160 are disposed, the first light L1 traveling laterally of the light emitting element 150 can be reflected to the upper side of the light emitting display apparatus 100 and an upper side of the light emitting element 150. Therefore, the first light L1 traveling in the lateral direction of the light emitting element 150 can be extracted, by the reflective part 160 on the partition 140, in the front direction of the light emitting display apparatus 100, whereby light extraction efficiency and front light extraction efficiency of the light emitting element 150 can be improved.

The reflective part 160 includes a first layer 161, a second layer 162, and a third layer 163. The first layer 161 is disposed on the partition 140. The first layer 161 can be formed of the same material as the first electrode 151. The first layer 161 can include a transparent conductive material and a reflective material. For example, the first layer 161 can be formed of a transparent conductive material such as tin oxide (TO), indium tin oxide (ITO), indium zinc oxide (IZO), indium tin zinc oxide (ITZO) or the like, and a reflective material having a highly reflective material such as silver (Ag) or an alloy of silver (Ag alloy), or the first layer 161 can be formed of only a reflective material, but embodiments are not limited thereto. For example, the first layer 161 can be formed of a reflective material disposed on the partition 140 and a transparent conductive material on the reflective material, and the first layer 161 can be formed of only a reflective material disposed on the partition 140, but embodiments are not limited thereto.

The second layer 162 is disposed on the first layer 161. The second layer 162 can be formed of the same material as the light emitting layer 152. For example, the second layer 162 can be formed of an organic material, or can be formed of the same material as a quantum dot light emitting layer and a micro-LED, but embodiments are not limited thereto.

The third layer 163 is disposed on the second layer 162. The third layer 163 can be formed of the same material as the second electrode 153. For example, the third layer 163 can be formed of a transparent conductive oxide such as indium tin oxide (ITO), indium zinc oxide (IZO), indium tin zinc oxide (ITZO), zinc oxide (ZnO), and tin oxide (TO) or an alloy of ytterbium (Yb), but embodiments are not limited thereto.

At least a portion of the light emitting element 150 and at least a portion of the reflective part 160 can be electrically separated from each other. Accordingly, at least a portion of the light emitting element 150 and at least a portion of the reflective part 160 can be electrically insulated from each other. For example, as illustrated in FIG. 2B, the second electrode 153 of the light emitting element 150 and the third layer 163 of the reflective part 160 can be spaced apart and electrically separated from each other.

As at least a portion of the light emitting element 150 and at least a portion of the reflective part 160 are electrically insulated from each other, defects such as bright spots or dark spots can be minimized.

If the second electrode 153 of the light emitting element 150 and the third layer 163 of the reflective part 160 are not completely spaced apart from each other, and the second electrode 153 and the third layer 163 are connected to each other with a small thickness thereof, current is concentrated in a connection portion and thus, a corresponding sub-pixel SP can become a bright spot.

In addition, in a state in which the light emitting layer 152 of the light emitting element 150 and the second layer 162 of the reflective part 160 are spaced apart from each other to thereby expose the first electrode 151, when the second electrode 153 is formed to be in contact with the first electrode 151, the first electrode 151 and the second electrode can be shorted, and a corresponding sub-pixel SP can become a dark spot.

Accordingly, when the second electrode 153 and the third layer 163 are spaced apart from each other, or the second electrode 153 and the third layer 163, and the light emitting layer 152 and the second layer 162 are simultaneously spaced apart from each other, or the entirety of the light emitting element 150 and the entirety of the reflective part 160 are spaced apart from each other, defects such as bright spots or dark spots can be minimized.

To electrically insulate at least a portion of the light emitting element 150 and at least a portion of the reflective part 160, an angle of the partition 140 can be 60 degrees or more. For example, the angle of the partition 140 may refer to an angle between a side surface and a lower surface of the partition 140 (e.g., angle θ2 of the partition 140 shown in FIG. 3B discussed below). When the partition 140 has an angle of 60 degrees or more, at least a portion of the light emitting element 150 and at least a portion of the reflective part 160 that are simultaneously formed of the same material can be separated from each other, whereby the at least a portion of the light emitting element 150 and the at least a portion of the reflective part 160 can be electrically insulated from each other.

For example, when the light emitting element 150 is formed, a material for forming the first electrode 151 can be deposited on the substrate 110, and the material can be patterned to form the first electrode 151. Subsequently, a material for forming the light emitting layer 152 can be deposited on the first electrode 151 to form the light emitting layer 152. Finally, a material for forming the second electrode 153 can be deposited on the light emitting layer 152 to form the second electrode 153.

When the material for forming the first electrode 151 is deposited on an entire surface of the substrate 110, the material for forming the first electrode 151 is also deposited on the partition 140 to form the first layer 161 of the reflective part 160. When the material for forming the light emitting layer 152 is deposited on the entire surface of the substrate 110 on which the first electrode 151 is formed, the material for forming the light emitting layer 152 is also deposited on the partition 140 to form the second layer 162 of the reflective part 160. Lastly, when the material for forming the second electrode 153 is deposited on the entire surface of the substrate 110 on which the light emitting layer 152 is formed, the material for forming the second electrode 153 is also deposited on the partition 140 to form the third layer 163 of the reflective part 160.

When depositing the material for forming the first electrode 151, the material for forming the light emitting layer 152, or the material for forming the second electrode 153, the partition 140 can function as a mask covering an area surrounding a lower portion of the partition 140. It can be difficult to deposit the material for forming the first electrode 151, the material for forming the light emitting layer 152, or the material for forming the second electrode 153, on an area covered by the partition 140, for example, on an upper surface of the overcoating layer 130 adjacent to the partition 140 and a lower side of the partition 140 adjacent to the upper surface of the overcoating layer 130. In addition, a shadow effect in which the material for forming the first electrode 151, the material for forming the light emitting layer 152, or the material for forming the second electrode 153 is not deposited on the area surrounding the lower portion of the partition 140 by the partition 140, can occur. And, due to the shadow effect, a shadow area on which the material forming the first electrode 151, the material forming the light emitting layer 152, the material forming the second electrode 153 or the like is not deposited, can increase. At least a portion of the light emitting element 150 and at least a portion of the reflective part 160 can be spaced apart from each other by the shadow area, so that the at least a portion of the light emitting element 150 and the at least a portion of the reflective part 160 can be electrically insulated from each other. For example, in the light emitting display apparatus 100 according to an exemplary embodiment of the present disclosure, as shown in FIG. 2B, at least the second electrode 153 of the light emitting element 150 and the third layer 163 of the reflective part 160 can be spaced apart and electrically insulated from each other.

As described above, the reflective area RA can be formed to have an island shape or an open curve shape. In addition, since the partition 140 and the reflective part 160 disposed in the reflective area RA are also formed in an open curve shape or an island shape, rather than a closed loop shape, the light emitting area EA can be secured maximally. At least a portion of the reflective part 160 of the reflective area RA and at least a portion of the light emitting element 150 of the light emitting area EA are electrically insulated from each other and for example, the second electrode 153 of the light emitting element 150 and the third layer 163 of the reflective part 160 can be spaced apart and electrically insulated from each other. Accordingly, since a voltage is not supplied to the third layer 163 of the reflective part 160 and the third layer 163 of the reflective part 160 is in a floating state, although the reflective part 160 of the reflective area RA can be formed of the same material as the light emitting element 150 in the same process, but it may not emit light. When the reflective area RA is disposed to completely surround one portion of the light emitting area EA, one portion of the light emitting element 150 disposed inside the reflective area RA can be electrically insulated from another portion of the light emitting element 150 disposed in the light emitting area EA outside the reflective area RA. For example, since the second electrode 153 disposed in the light emitting area EA outside the reflective area RA and the second electrode 153 disposed inside the reflective area RA are separated from each other by the reflective part 160, the second electrode 153 disposed inside the reflective area RA can be floated. Therefore, the light emitting area EA surrounded by the reflective area RA, can be a non-light emitting area that does not substantially emit light, so that the area of the light emitting area EA can be reduced. Accordingly, the reflective area RA and the reflective part 160 are formed to have an island shape, an open curve shape, or the like in each of the plurality of sub-pixels SP, so that the light emitting area EA can be integrally formed.

In FIG. 2B, only the second electrode 153 and the third layer 163 are illustrated as being separated, but embodiments are not limited thereto. For example, the second electrode 153 and the third layer 163, and the light emitting layer 152 and the second layer 162 can be separated from each other, And, the second electrode 153 and the third layer 163, the light emitting layer 152 and the second layer 162, and the first electrode 151 and the first layer 161 can be further separated from each other, but embodiments are not limited thereto.

Hereinafter, the shadow effect and the shadow area occurring by the partition 140 will be described with reference to FIGS. 3A to 4D.

Figure 3A:
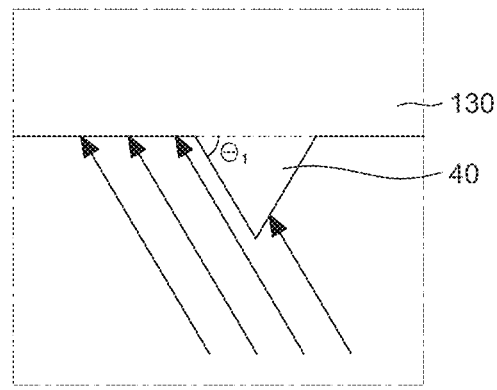
FIG. 3A is a cross-sectional view for illustrating a shadow region by a partition having a first angle in a light emitting display apparatus according to a comparative example.
Figure 3B:
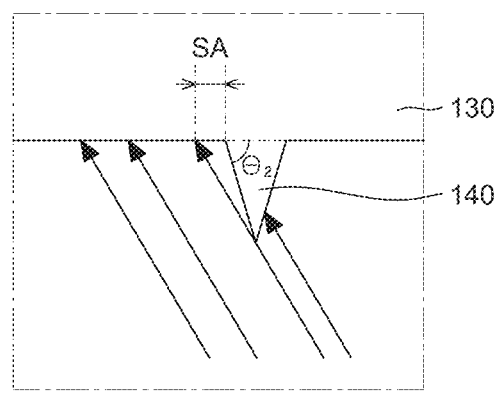
FIG. 3B is a cross-sectional view for illustrating a shadow region by a partition having a second angle in a light emitting display apparatus according to an exemplary embodiment of the present disclosure.

FIG. 3A is a cross-sectional view for illustrating a shadow region by a partition having a first angle in a light emitting display apparatus according to a comparative example. FIG. 3B is a cross-sectional view for illustrating a shadow area by a partition having a second angle in a light emitting display apparatus according to an exemplary embodiment of the present disclosure.

In FIGS. 3A and 3B, only partitions 40 and 140 and the overcoating layer 130 are illustrated for convenience of description. Heights of the partition 40 according to the comparative example and the partition 140 according to an exemplary embodiment of the present disclosure are identical to each other, a first angle θ1 of the partition 40 according to the comparative example is an angle of less than 60 degrees, and a second angle θ2 of the partition 140 according to an embodiment of the present disclosure is 60 degrees or more.

With reference to FIGS. 3A and 3B, a metal material or an organic material can be deposited on the overcoating layer 130 on which the partition 40 or 140 is disposed. For example, an organic material for forming the light emitting layer 152 can be deposited by a chemical vapor deposition (CVD) method, and a metal material for forming the first electrode 151 and the second electrode 153 can be deposited by a physical vapor deposition (PVD) method.

When using a physical vapor deposition (PVD) method, metal materials from a target material can move straight in one direction. In addition, some of the metal materials moving straight in one direction can be interrupted by the partition 40 or 140. And, some of the metal materials can be interrupted by the partition 40 or 140, so that a shadow effect in which the interrupted metal material is not deposited on the area surrounding the lower portion of the partition 40 or 140 can occur. For example, in the light emitting display apparatus according to the comparative example, the movement of metal materials traveling toward some portion of the upper surface of the overcoating layer 130 adjacent to the partition 40 and a lower side portion of the partition 40 adjacent to the upper surface of the overcoating layer 130 can be interrupted by the partition 40. In the light emitting display apparatus according to the exemplary embodiment, the movement of metal materials traveling toward some portion of the upper surface of the overcoating layer 130 adjacent to the partition 140 and the lower side portion of the partition 140 adjacent to the upper surface of the overcoating layer 130 can be interrupted by the partition 140. For example, the shadow effect can occur by the partitions 40 and 140, and the shadow area SA where the metal material is not deposited by the shadow effect can occur.

Therefore, even when the partitions 40 and 140 exist, the shadow area SA may not occur or the shadow area SA can occur based on an angle of the partition 40 or 140. As the angle of the partition 40 or 140 increases, the area of the shadow area SA which is shaded by the partition 40 or 140 and is unfeasible to deposit a metal material thereon, can increase.

Hereinafter, it will be explained assuming that metal materials move straight in one direction, along arrows of FIGS. 3A and 3B.

With reference to FIG. 3A of the comparative example, a metal material can be deposited on the overcoating layer 130 on which the partition 40 having the first angle θ1 is disposed, as in the comparative example. Even when the partition 40 is present on the overcoating layer 130, since the partition 40 has a relatively low first angle θ1, the shade area SA which is unfeasible to deposit a metal material thereon can be minimized. In this case, the third layer 163 of the reflective part 160 and the second electrode 153 of the light emitting element 150 are not completely separated from each other, and can be connected to each other with at least a portion thereof.

With reference to FIG. 3B according to the present disclosure, a metal material can be deposited on the overcoating layer 130 on which the partition 140 having the second angle θ2 is disposed, as in the embodiment of the present disclosure. In addition, since the partition 140 according to an embodiment of the present disclosure has a second angle θ2 higher than the first angle θ1 of the partition 40 according to the comparative example, the amount of metal materials, the movement of which is interrupted by the partition 140 according to an embodiment of the present disclosure, can increase, and the area of the shadow area SA which is unfeasible to deposit a metal material thereon can increase. Therefore, as shown in FIG. 2B, the second electrode 153 and the third layer 163 can be effectively and completely separated from each other without being connected to each other, by the shadow effect.

Hereinafter, with reference to FIGS. 4A to 4D, results of the formation of a first material layer MLa to a fourth material layer MLd according to angles of respective first to fourth structures SRa to SRd will be described.

Figure 4A:
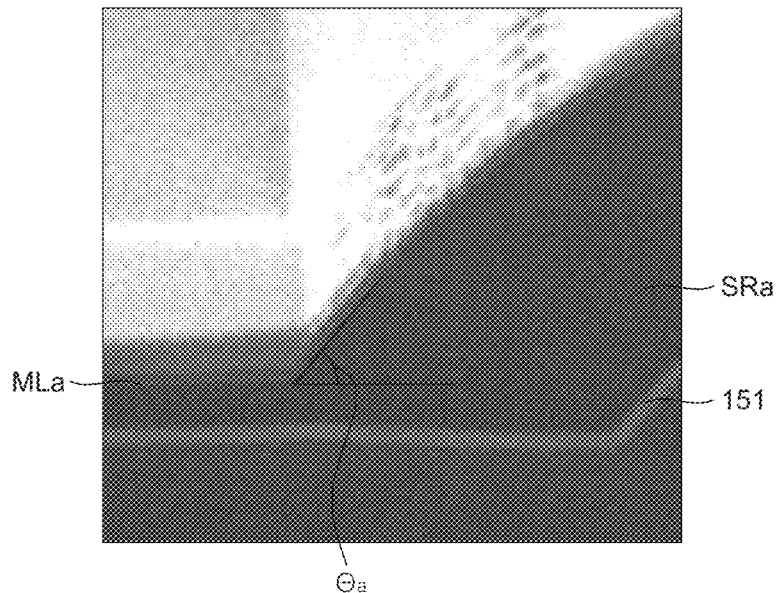
FIGS. 4A to 4D are images for illustrating areas of material layers formed according to angles of structures.
Figure 4B:
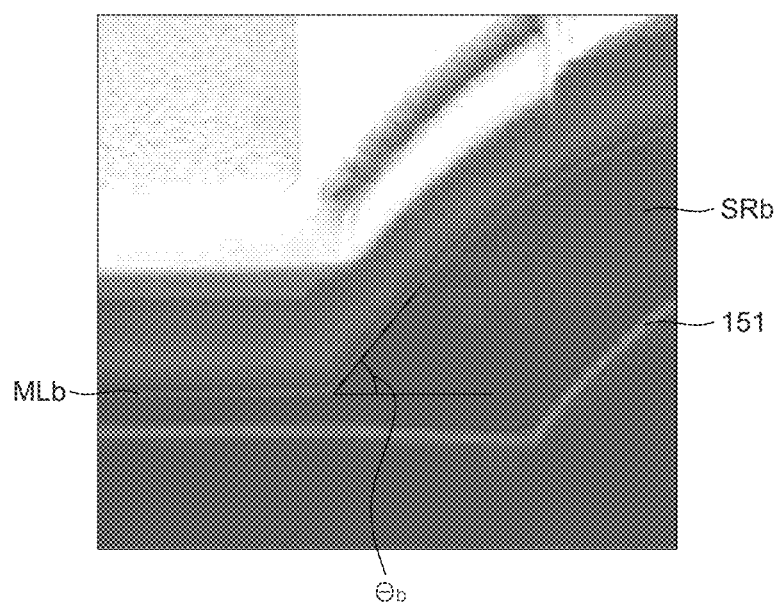
Figure 4C:
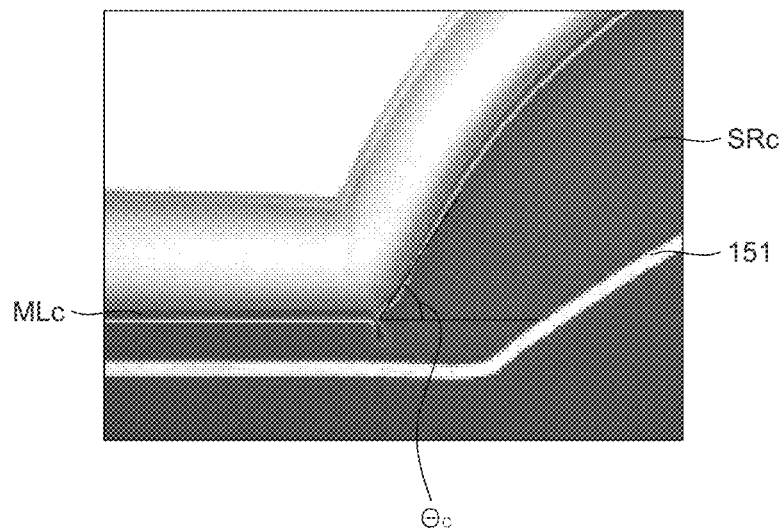
Figure 4D:
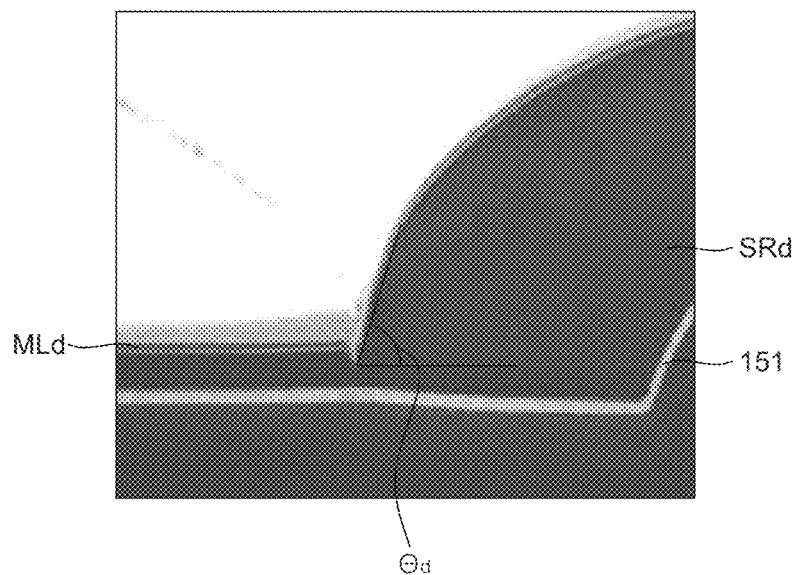

FIGS. 4A to 4D are images for illustrating forming areas of material layers according to examples of various angles of structures. FIG. 4A is a view illustrating a result of formation of the first material layer MLa when an angle θa of the first structure SRa is 50.2 degrees. FIG. 4B is a view illustrating a result of formation of a second material layer MLb when an angle θb of a second structure SRb is 57.5 degrees. FIG. 4C is a view illustrating a result of formation of a third material layer MLc when an angle θc of a third structure SRc is 60 degrees. FIG. 4D is a view illustrating a result of formation of the fourth material layer MLd when an angle θd of the fourth structure SRd is 72.5 degrees.

FIGS. 4A to 4D are images obtained by simulating the results of formation of the first material layer MLa to the fourth material layer MLd by disposing the first structure SRa to the fourth structure SRd having different angles on the first electrode 151. In FIGS. 4A to 4D, the results of formation of the first material layer MLa to the fourth material layer MLd according to the first structure SRa to the fourth structure SRd having different angles are simulated. However, the results of formation of the first material layer MLa to the fourth material layer MLd according to the angles θa, θb, θc, θd of the first structure SRa to the fourth structure SRd can be substantially identical to the results of formation of the light emitting element 150 depending on angles of the partition 40.

Hereinafter, it will be explained assuming that the first material layer MLa to the fourth material layer MLd are formed of the same material, and the first material layer MLa to the fourth material layer MLd are provided as a material for forming at least a portion of the light emitting element 150. For example, the first material layer MLa to the fourth material layer MLd can be a material for forming the light emitting layer 152, can be a material for forming the second electrode 153, or can be a material containing both the material for forming the light emitting layer 152 and the material for forming the second electrode 153.

With reference to FIGS. 4A and 4B, the angle θa of the first structure SRa can be 50.2 degrees, and the angle θb of the second structure SRb can be 57.5 degrees. The angle θa between the first electrode 151 and the first structure SRa, and the angle θb of the first electrode 151 and the second structure SRb can be 50.2 degrees and 57.5 degrees, respectively.

The first material layer MLa and the second material layer MLb can be deposited on the first electrode 151 and the first structure SRa, and the first electrode 151 and the second structure SRb, respectively. When the angle θa of the first structure SRa and the first electrode 151 and the angle θb of the second structure SRb and the first electrode 151 are less than 60 degrees, it can be confirmed that the first material layer MLa and the second material layer MLb are uniformly deposited on the first electrode 151 and the first structure SRa, and the first electrode 151 and the second structure SRb, respectively. Thus, when the angle θa between the first structure SRa and the first electrode 151 and the angle θb between the second structure SRb and the first electrode 151 are less than 60 degrees, it can be confirmed that the shadow effect is minimized.

With reference to FIGS. 4C and 4D, the angles θc and θd of the third structure SRc and the fourth structure SRd can be 60 degrees and 72.5 degrees, respectively. The angle θc of the first electrode 151 and the third structure SRc and the angle θd of the first electrode 151 and the fourth structure SRd can be 60 degrees and 72.5 degrees, respectively.

The third material layer MLc and the fourth material layer MLd can be deposited on the first electrode 151 and the third structure SRc, and the first electrode 151 and the fourth structure SRd, respectively. When the angle θc of the third structure SRc and the first electrode 151 and the angle θd of the fourth structure SRd, and the first electrode 151 are 60 degrees or more, it can be confirmed that the third material layer MLc and the fourth material layer MLd are not uniformly deposited on the third structure SRc and the first electrode 151, and the fourth structure SRd, and the first electrode 151, respectively.

For example, it can be confirmed that the third material layer MLc is not uniformly deposited in an area which is a boundary between the first electrode 151 and the third structure SRc and which is adjacent to a lower side of the third structure SRc, and a portion of the third material layer MLc is disconnected. Thus, when the angle θc formed by the first electrode 151 and the third structure SRc and the angle θd formed by the first electrode 151 and the fourth structure SRd are 60 degrees or more, the shadow effect occurs and it can be confirmed that the third material layer MLc and the fourth material layer MLd are partially separated.

Accordingly, when the third structure SRc and the fourth structure SRd having the angles θc and θd of 60 degrees or more, the third material layer MLc and the fourth material layer MLd can be disconnected in areas thereof adjacent to lower sides of the third structure SRc and the fourth structure SRd. Therefore, when the angle of the partition 140 is 60 degrees or more, at least a portion of the reflective part 160 and at least a portion of the light emitting element 150 that are formed in the same process with the use of the same material can be separated from each other, in the area thereof adjacent to the lower side of the partition 140. At least a portion of the reflective part 160 and at least a portion of the light emitting element 150 are separated and electrically insulated from each other, whereby defects such as bright spots or dark spots can be minimized.

In the light emitting display apparatus 100 according to an exemplary embodiment of the present disclosure, at least a portion of the reflective part 160 and at least a portion of the light emitting element 150 can be separated by adjusting the angle of the partition 140, and at least a portion of the reflective part 160 and at least a portion of the light emitting element 150 can be electrically insulated from each other. For example, when the second electrode 153 of the light emitting element 150 and the third layer 163 of the reflective part 160 are not completely spaced apart from each other and are connected to each other with a small thickness thereof, current is concentrated at a connection portion and thus, the sub-pixel SP corresponding thereto can become a bright point. In addition, in a state in which the light emitting layer 152 and the second layer 162 are spaced apart from each other to expose the first electrode 151, when the second electrode 153 is formed to be in contact with the exposed first electrode 151, the second electrode 153 and the first electrode 151 can be shorted and the sub-pixel SP corresponding thereto can become a dark spot. Accordingly, in the light emitting display apparatus 100 according to an exemplary embodiment of the present disclosure, the partition 140 is formed at an angle of 60 degrees or more to separate at least a portion of the light emitting element 150 from at least a portion of the reflective part 160, whereby defects such as bright spots and dark spots can be minimized. For example, in the light emitting display apparatus 100 according to an exemplary embodiment of the present disclosure, the angle of the partition 140 is formed to be 60 degrees or more, whereby a shadow effect can occur and the second electrode 153 of the light emitting element 150 and the third layer 163 of the reflective part 160 can be separated and electrically insulated from each other, thereby minimizing of defects such as bright spots and dark spots.

In the light emitting display apparatus 100 according to an exemplary embodiment of the present disclosure, at least a portion of light traveling laterally of the light emitting element 150 can be reflected to the upper portion of the light emitting display apparatus 100 by disposing the reflective area RA surrounded by the light emitting area EA, so that light extraction efficiency can be improved. First, a majority of light emitted from the light emitting layer 152 of the light emitting element 150 can travel to the upper portion of the light emitting display apparatus 100 to display an image. For example, some of the light emitted from the light emitting layer 152 can travel laterally of the light emitting element 150. In addition, a majority of the light traveling laterally of the light emitting element 150 can be absorbed on or totally reflected by various components of the light emitting display apparatus 100 and may not be extracted to the outside of the light emitting display apparatus 100, whereby light extraction efficiency of the light emitting display apparatus 100 can be lowered. Accordingly, in the light emitting display apparatus 100 according to an exemplary embodiment of the present disclosure, at least a portion of the light traveling laterally of the light emitting element 150 can be reflected to an upper portion of the light emitting element 150 and the upper portion of the light emitting display apparatus 100, by disposing the reflective part 160 in the reflective area RA of the sub-pixel SP.

For example, some of the light emitted from the light emitting element 150 can travel toward the neighboring sub-pixels SP or toward the bank 170, rather than toward the upper portion of the light emitting display apparatus 100. At least a portion of the light directed laterally of the light emitting element 150 can be reflected from the first layer 161 of the reflective part 160 disposed adjacent to the light emitting area EA to the upper portion of the light emitting display apparatus 100. For example, as illustrated in FIG. 2B, the first light L1 directed laterally of the light emitting element 150 can be reflected by the reflective part 160 and travel in the front direction of the light emitting display apparatus 100. Accordingly, some of the light emitted from the light emitting element 150 can be reflected to the upper portion of the light emitting display apparatus 100, and light to be lost laterally of the light emitting element 150 can be extracted in the front direction of the light emitting display apparatus 100. Therefore, in the light emitting display apparatus 100 according to an exemplary embodiment of the present disclosure, the reflective area RA can be disposed in the light emitting area EA to allow for improvements in light extraction efficiency of the light emitting element 150 and improvements in brightness of the light emitting display apparatus 100.

Figure 5A:
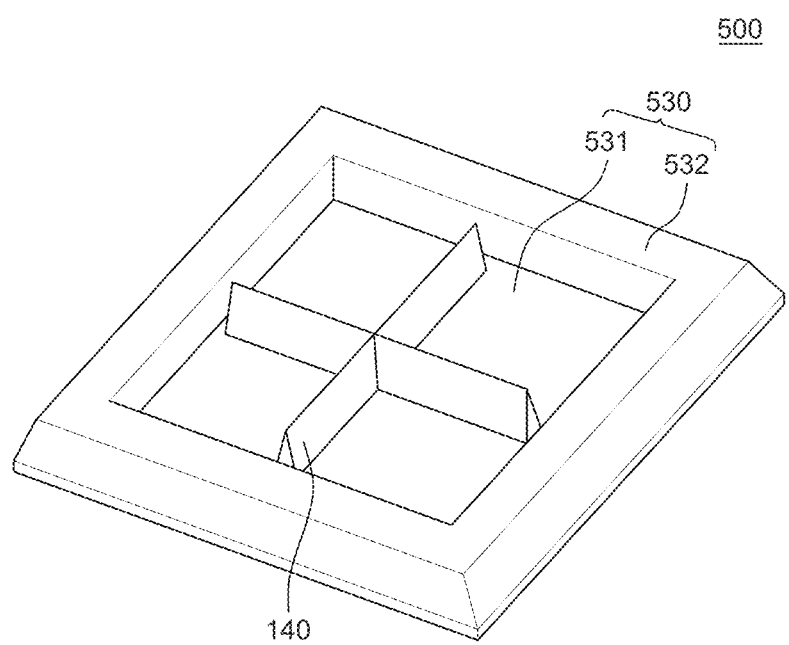
FIG. 5A is a perspective view of an overcoating layer and a partition in a light emitting display apparatus according to another exemplary embodiment of the present disclosure.
Figure 5B:
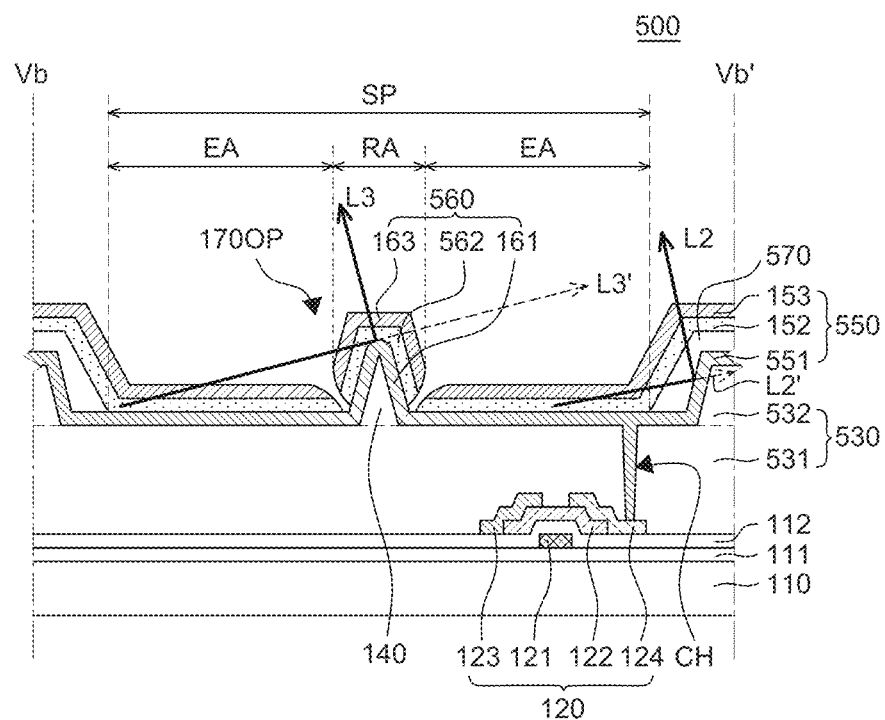
FIG. 5B is a cross-sectional view of the light emitting display apparatus according to another exemplary embodiment of the present disclosure.

FIG. 5A is a perspective view of an overcoating layer and a partition in a light emitting display apparatus according to another exemplary embodiment of the present disclosure. FIG. 5B is a cross-sectional view of the light emitting display apparatus according to another exemplary embodiment of the present disclosure. A light emitting display apparatus 500 of FIGS. 5A and 5B is different from the light emitting display apparatus 100 of FIGS. 1 to 2B, in terms of an overcoating layer 530, and other components thereof are substantially the same as those of the light emitting display apparatus 100 of FIGS. 1 to 2B. Thus, a redundant description will be omitted or may be brief. In FIG. 5A, only the overcoating layer 530 and the partition 140 are illustrated for convenience of description.

With reference to FIGS. 5A and 5B, the overcoating layer 530 includes a base portion 531 and a protrusion portion 532.

The base portion 531 is disposed between the substrate 110 and a light emitting element 550. The base portion 531 of the overcoating layer 530 can planarize an upper portion of the substrate 110 on which the thin film transistor 120 is disposed. The base portion 531 includes a contact hole CH for electrically connecting the thin film transistor 120 and the light emitting element 550 to each other.

The protrusion portion 532 is disposed on the base portion 531. The protrusion portion 532 can be disposed between the base portion 531 and the light emitting element 550. The protrusion portion 532 can be integrally formed with the base portion 531 and can be formed to protrude from the base portion 531. The protrusion portion 532 can be disposed in an area between the plurality of sub-pixels SP.

A first electrode 551 is disposed on the base portion 531 and the protrusion portion 532 of the overcoating layer 530. The first electrode 551 can be disposed to extend from the base portion 531 to an upper surface of the protrusion portion 532. The first electrode 551 can be disposed on an upper surface of the base portion 531, a side surface of the protrusion portion 532, and the upper surface of the protrusion portion 532.

A bank 570 is disposed on the protrusion portion 532 and the first electrode 551. The bank 570 can be disposed to cover the protrusion portion 532 disposed between each of the plurality of sub-pixels SP. The bank 570 can be disposed to cover a portion of the first electrode 551 disposed on the side surface of the protrusion portion 532 and the upper surface of the protrusion portion 532.

A reflective part 560 is disposed on the partition 140. The first layer 161 of the reflective part 560 and the first electrode 551 of the light emitting element 550 can be integrally formed. On the other hand, a second layer 562 of the reflective part 560 and the light emitting layer 152 of the light emitting element 550 can be separated and electrically insulated from each other. The third layer 163 of the reflective part 560 and the second electrode 153 of the light emitting element 550 can be separated and electrically insulated from each other.

A portion of the first electrode 551 including the reflective layer is disposed on the side surface of the protrusion portion 532 to reflect at least a portion of light traveling laterally of the light emitting element 550 toward an upper portion of the light emitting display apparatus 500.

In this case, the reflective part 560 disposed on the partition 140, together with a portion of the first electrode 551 disposed on the side surface of the protrusion portion 532, can also reflect at least a portion of the light traveling laterally of the light emitting element 550 to the upper portion of the light emitting display apparatus 500. Accordingly, the protrusion portion 532 and the partition 140 can be disposed together, so that the amount of light reflected to the upper portion of the light emitting display apparatus 500, by a portion of the first electrode 551 on the side surface of the protrusion portion 532 and the reflective part 560 on the partition 140, can increase.

As shown in FIG. 5B, when the protrusion portion 532 is disposed, it is assumed that light traveling laterally of the light emitting element 550 in a direction away from the reflective part 560 is referred to as second light L2. When the protrusion portion 532 is not disposed, it is assumed that the light traveling laterally of the light emitting element 550 in the direction away from the reflective part 560 is referred to as second light L2'.

Unlike the case illustrated in FIG. 5B, when the protrusion portion 532 is not disposed, the second light L2' traveling laterally of the light emitting element 550 in the direction away from the reflective part 560 can continuously move in a lateral direction of the light emitting element 550. Therefore, even when the reflective part 560 is disposed in the sub-pixel SP, the second light L2' which is in the direction away from the reflective part 560 and which travels laterally of the light emitting element 550 may not be extracted in a front direction of the light emitting display apparatus 500, and can be lost within the light emitting display apparatus 500.

As shown in FIG. 5B, when the protrusion portion 532 is disposed, the second light L2 traveling laterally of the light emitting element 550 in the direction away from the reflective part 560 can be reflected to the upper portion of the light emitting display apparatus 500 by the first electrode 551 on the side surface of the protrusion portion 532. Therefore, the second light L2 traveling laterally of the light emitting element in the direction away from the reflective part 560 even when the reflective part 560 is disposed in the sub-pixel SP can be extracted in the front direction of the light emitting display apparatus 500 by the first electrode 551 on the protrusion portion 532, so that light extraction efficiency of the light emitting element 550 can be improved.

If the partition 140 is not disposed and only the protrusion portion 532 is disposed, some of light directed toward the protrusion portion 532 may not reach the protrusion portion 532, and light lost can increase. For example, the reflective part 560 is disposed between the protrusion portions 532, and a distance between the reflective layer of the first electrode 551 and the reflective material of the first layer 161 is reduced, whereby light to be lost without reaching the protrusion portion 532 can be minimized.

As shown in FIG. 5B, when the reflective part 560 and the protrusion portion 532 are disposed together, it is assumed that light traveling laterally of the light emitting element 550 is referred to as third light L3. In addition, when the reflective part 560 is not disposed and only the protrusion portion 532 is disposed, it is assumed that the light traveling laterally of the light emitting element 550 is referred to as third light L3'.

Unlike the case illustrated in FIG. 5B, when the reflective part 560 is not disposed and only the protrusion portion 532 is disposed, the third light L3' traveling in the lateral direction of the light emitting element 550 can move toward the protrusion portion 532. The third light L3' may not reach the protrusion portion 532 and can be lost. Therefore, even when the protrusion portion 532 is disposed, the third light L3' traveling in the lateral direction of the light emitting element 550 may not reach the protrusion portion 532 and can be lost within the light emitting display apparatus 500.

As shown in FIG. 5B, when the protrusion portion 532 and the reflective part 560 are disposed together, the third light L3 traveling in the lateral direction of the light emitting element 550 can move toward the protrusion portion 532. For example, the third light L3 can be reflected toward the upper portion of the light emitting display apparatus 500 by the reflective part 560 before the third light L3 does not reach the protrusion portion 532 and is lost. Thus, since the reflective part 560 is disposed between the protrusion portion 532 and the next protrusion portion 532, a movement distance of light, such as the third light L3, moving to the first electrode 551 on the side surface of the protrusion portion 532 can decrease to a movement distance to the reflective part 560. For example, the movement distance of the third light L3 towards the first electrode 531 is reduced to correspond to the movement distance of light towards the reflective part 560 due to the presence of the reflective part 560. Therefore, since the movement distance of the light traveling in the lateral direction of the light emitting element 550 to the first electrode 551 including the reflective material on the side surface of the protrusion portion 532 is reduced to a movement distance to the reflective part 560, the probability that the light traveling in the lateral direction of the light emitting element 550 is lost can also be reduced. And, the third light L3 can be extracted in the front direction of the light emitting display apparatus 500 before it is lost, and light extraction efficiency, for example, front light extraction efficiency of the light emitting element 550 can be improved. Hereinafter, light extraction effects according to an arrangement of the reflective part 560 will be described with reference to FIGS. 6A to 6C.

Figure 6A:
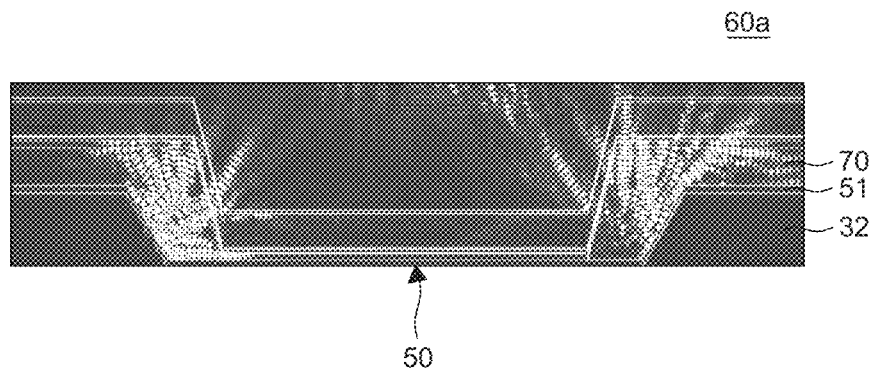
FIG. 6A shows a traveling path of light in a light emitting display apparatus according to another comparative example, through simulation.
Figure 6B:
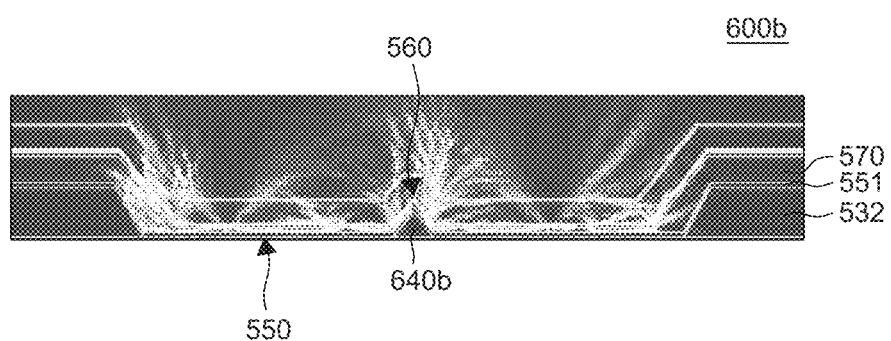
FIGS. 6B and 6C show traveling paths of light in light emitting display apparatuses according to exemplary embodiments 1 and 2 of the present disclosure, through simulation.
Figure 6C:
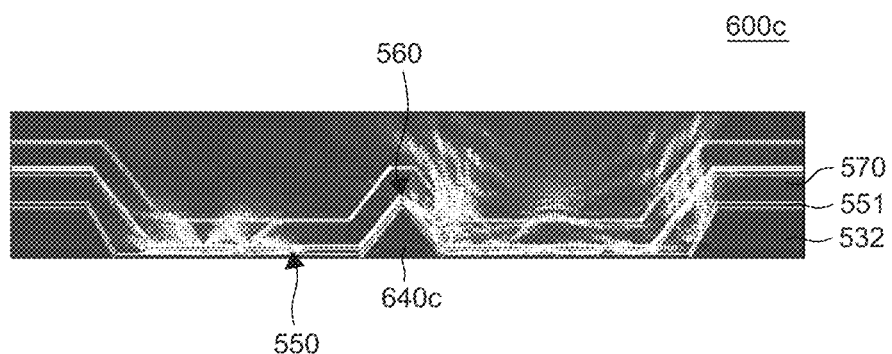

FIG. 6A shows a traveling path of light in a light emitting display apparatus according to another comparative example, through simulation. FIGS. 6B and 6C show traveling paths of light in light emitting display apparatuses according to exemplary embodiments 1 and 2 of the present disclosure, through simulation.

A light emitting display apparatus 60a according to the comparative example of FIG. 6A is different from the light emitting display apparatus 500 according to another embodiment of the present disclosure in that the partition 140 and the reflective part 560 are not disposed, and other components thereof are substantially the same as those of the light emitting display apparatus 500 according to another embodiment of the present disclosure. Thus, a redundant description will be omitted or may be briefly provided.

A light emitting display apparatus 600b according to the exemplary embodiment 1 of FIG. 6B and a light emitting display apparatus 600c according to the exemplary embodiment 2 of FIG. 6C are different from the light emitting display apparatus 500 according to another embodiment of the present disclosure, only in terms of heights of partitions 640b and 640c, and are substantially the same as the light emitting display apparatus 500. Thus, a redundant description will be omitted or may be briefly provided. FIGS. 6A to 6C are simulation images using a finite difference time domain (FDTD) simulation, in which portions shown in white represent light extraction results.

In each of the light emitting display apparatuses 60a, 600b, and 600c according to the comparative example (60a) and the exemplary embodiments 1 and 2 (600b and 600c) of the present disclosure, heights of protrusion portions 32 and 532 were set to 2 µm, angles of the protrusion portions 32 and 532 (for example, the angle between a side surface and a lower surface of each of the protrusion portions) were set to 60 degrees, and angles of banks 70 and 570 were set to 50 degrees. In the light emitting display apparatuses 600b and 600c according to the exemplary embodiments 1 and 2 of the present disclosure, angles of the partitions 640b and 640c (for example, the angle between a side surface and a lower surface of each of the protrusion portions) were set to 60 degrees. In the exemplary embodiment 1, a height of the partition 640b was set to 1 µm and in the exemplary embodiment 2, a height of the partition 640c was set to 2 µm. According to the exemplary embodiments of the present disclosure, preferably, a height of the partition is lower than or equal to a height of the protrusion portion.

First, with reference to FIG. 6A, in the light emitting display apparatus 60a according to the comparative example, it could be confirmed that only in the vicinity of the protrusion portion 32, light is reflected to an upper side of the light emitting display apparatus 60a. Light traveling laterally of a light emitting element 50 can be reflected to the upper side of the light emitting display apparatus 60a by the reflective layer of the first electrode 51 disposed on a side surface of the protrusion portion 32.

Since the protrusion portion 32 is located only outside the light emitting element 50, some of light emitted from the inside of the light emitting element 50 may not reach the first electrode 51 on the side surface of the protrusion portion 32. For example, light emitted from the center of the light emitting element 50 can be unfeasible to reach the protrusion portion 32 disposed outside the light emitting element 50. In addition, in light directed laterally of the light emitting element 50, some of the light that does not reach the first electrode 51 on the side surface of the protrusion portion 32 is lost, whereby light extraction efficiency and brightness of the light emitting display apparatus 60a are lowered.

With reference to FIG. 6B, in the light emitting display apparatus 600b according to the first exemplary embodiment of the present disclosure, it could be confirmed that in the vicinity of the protrusion portion 532, light is reflected to an upper portion of the light emitting display apparatus 600b, and in the vicinity of the reflective part 560 on the partition 640b, light is reflected to the upper portion of the light emitting display apparatus 600b. Light traveling laterally of the light emitting element 550 can be reflected to the upper portion of the light emitting display apparatus 600b by the reflective layer of the first electrode 551 disposed on the side surface of the protrusion portion 532, and the reflective part 560 on the partition 640b.

In comparison with the light emitting display apparatus 60a according to the comparative example, in the light emitting display apparatus 600b according to the first exemplary embodiment of the present disclosure, since the reflective part 560 is positioned between the protrusion portion 532 and the next protrusion portion 532 disposed on the outermost side of the light emitting element 550, a distance between the first electrode 551 and the reflective position from which light is reflected, can be reduced, i.e., can be reduced from a distance between the first electrode 551 and the protrusion portion 532 to a distance between the first electrode 551 and the reflective part 560. Some of light that is unfeasible to reach the protrusion portion 532 disposed outside the light emitting element 550, can be reflected to the upper portion of the light emitting display apparatus 600b by the reflective part 560 disposed inside the light emitting element 550. Therefore, in the light emitting display apparatus 600b according to the first exemplary embodiment of the present disclosure, the partition 640b and the reflective part 560 are disposed together inside the light emitting element 550, so that light extracted in the front direction of the light emitting display apparatus 600b can increase.

With reference to FIG. 6C, in the light emitting display apparatus 600c according to the second exemplary embodiment of the present disclosure, it could be confirmed that in the vicinity of the protrusion portion 532, light is reflected to an upper portion of the light emitting display apparatus 600c and in the vicinity of the partition 640c, light is reflected to the upper portion of the light emitting display apparatus 600c. For example, it could be confirmed that the light emitting display apparatus 600c according to the second exemplary embodiment of the present disclosure is the same as the light emitting display apparatus 600b according to the first exemplary embodiment of the present disclosure, in that light is extracted in the vicinity of the first electrode 551 on the protrusion portion 532 and in the vicinity of the reflective part 560 on the partition 640c.

In addition, in comparison with the light emitting display apparatus 600b according to the first exemplary embodiment of the present disclosure in which a height of the partition 640b is 1 µm, in the light emitting display apparatus 600c according to the second exemplary embodiment of the present disclosure in which a height of the partition 640c is 2 µm, front light extraction efficiency can be further improved. For example, as the heights of the partitions 640b and 640c increase, the area of the reflective part 560 can also increase, and light incident on the reflective part 560 can also increase. Therefore, as the heights of the partitions 640b and 640c increase, the area of the reflective part 560 increases, whereby light reflected to the upper sides of the light emitting display apparatuses 600b and 600c by the reflective part 560 can increase.

Hereinafter, light extraction efficiency of each of the light emitting display apparatuses 60a, 600b, and 600c according to the comparative example (60a) and the exemplary embodiments 1 and 2 (600b and 600c) of the present disclosure will be explained with reference to Table 1.

TABLE 1

|  | Comparative Example | Exemplary Embodiment 1 | Exemplary Embodiment 2 |
|---|---|---|---|
| T.E. | 1.00 | 1.21 | 1.25 |
| T.M. | 1.00 | 3.47 | 3.49 |

In Table 1, a horizontally oriented dipole moment and a vertically oriented dipole moment were set to 1 in the light emitting display apparatus 60a according to the comparative example, and on the basis of the light emitting display apparatus 60a according to the comparative example, a horizontally oriented dipole moment and a vertically oriented dipole moment occurring in the light emitting display apparatuses 600b and 600c according to the exemplary embodiments 1 and 2 of the present disclosure were measured.

T.E indicates the horizontally oriented dipole moment and T.M indicates the vertically oriented dipole moment. In the light emitting elements 50 and 550, electrons and holes are combined with each other to emit light. For example, the combination of electrons and holes can form the horizontally oriented dipole moment and the vertically oriented dipole moment. The horizontally oriented dipole moment is disposed in a direction parallel to upper surfaces of the light emitting elements 50 and 550 to emit light in a vertical direction of the light emitting elements 50 and 550. The vertically oriented dipole moment is disposed in a direction perpendicular to the upper surfaces of the light emitting elements 50 and 550 to emit light in a horizontal direction of the light emitting elements 50 and 550. Therefore, light emission efficiency can increase as the horizontally oriented dipole moment and the vertically oriented dipole moment increase.

With reference to Table 1, in both the light emitting display apparatuses 600b and 600c according to the exemplary embodiments 1 and 2 of the present disclosure where the reflective part 560 is further disposed, as compared to the light emitting display apparatus 60a according to the comparative example, it could be confirmed that the horizontally oriented dipole moment and the vertically oriented dipole moment increase. Therefore, in the light emitting display apparatuses 600b and 600c according to the exemplary embodiments 1 and 2 of the present disclosure, it could be confirmed that light extraction efficiency is improved by further disposing the partitions 640b and 640c and the reflective part 560.

In the light emitting display apparatus 500 according to another exemplary embodiment of the present disclosure, the first electrode 551 including the reflective layer is disposed on the side surface of the protrusion portion 532 and the reflective part 560 is disposed inside the light emitting element 550, whereby light extraction efficiency of the light emitting element 550 can be improved. For example, when the partitions 640b and 640c are not disposed and only the protrusion portion 532 is disposed, light traveling laterally of the light emitting element 550 in the vicinity of the protrusion portion 532 can be reflected toward the upper side of the light emitting display apparatus 500. However, since the protrusion portion 532 is disposed at the outermost side of the light emitting element 550, there can exist light that is lost before reaching the protrusion portion 532.

Unlike this, in the light emitting display apparatus 500 according to another exemplary embodiment of the present disclosure, since the reflective part 560 is further disposed between the protrusion portion 532 and the protrusion portion 532, a maximum width of the light emitting area EA can decrease and a maximum movement distance of light can also be reduced. Therefore, light lost during the movement thereof beyond a certain distance can be reduced as the maximum movement distance of light decreases. And, light reaching the reflective layer of the first electrode 551 and the first layer 161 of the reflective part 560 can increase. For example, since the reflective part 560 is disposed between the protrusion portion 532 and the protrusion portion 532, the maximum movement distance needed for light emitted from the light emitting element 550 to reach the first electrode 551 or the first layer 161 can be reduced. In addition, in the light emitted from the light emitting element 550, some of the light which is unfeasible to reach the first electrode 551 on the protrusion portion 532, can be reflected from the first layer 161 of the reflective part 560 to the upper portion of the light emitting display apparatus 500. Accordingly, in the light emitting display apparatus 500 according to another embodiment of the present disclosure, the protrusion portion 532 and the reflective part 560 are disposed together, so that light reflected to the upper portion of the light emitting display apparatus 500 can increase.

FIGS. 7A to 7E are enlarged plan views of a plurality of sub-pixels in light emitting display apparatuses according to various embodiments of the present disclosure. Light emitting display apparatuses 700a, 700b, 700c, 700d, and 700e of FIGS. 7A to 7E are different from the light emitting display apparatus 100 of FIGS. 1 to 2B and the light emitting display apparatus 500 of FIGS. 5A and 5B, in terms of the reflective area RA, but other components thereof are substantially the same as those of the light emitting display apparatuses 100 and 500. Thus, a redundant description will be omitted or may be provided briefly.

Figure 7A:
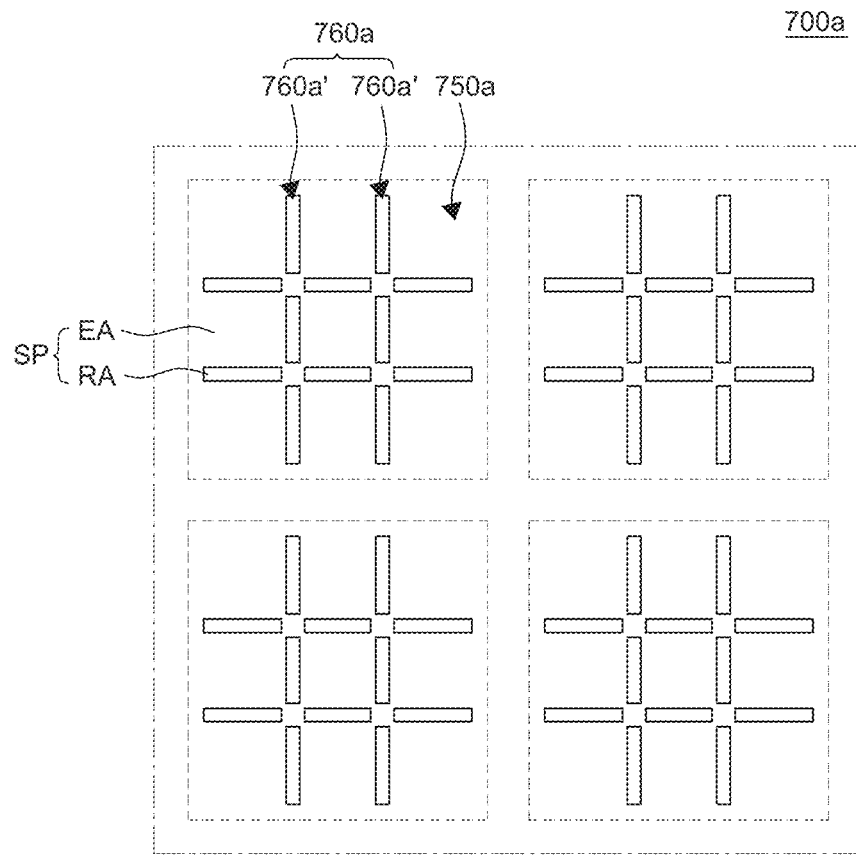
FIGS. 7A to 7E are enlarged plan views of a plurality of sub-pixels in light emitting display apparatuses according to various embodiments of the present disclosure.

With reference to FIG. 7A, one sub-pixel SP includes a plurality of reflective areas RA. A reflective part 760a can include a plurality of sub-reflective parts 760a' disposed on each of the plurality of reflective areas RA. For example, the plurality of reflective areas RA and the plurality of sub-reflective parts 760a' can form a lattice shape.

The plurality of reflective areas RA can be spaced apart from each other. The light emitting area EA can be disposed to surround the plurality of reflective areas RA spaced apart from each other, and can be integrally formed. For example, one sub-pixel SP can include a plurality of reflective areas RA and one light emitting area EA.

In addition, a light emitting element 750a of the light emitting area EA can be disposed between the plurality of reflective areas RA that are spaced apart from each other. Therefore, the light emitting element 750a disposed on the light emitting area EA surrounding the plurality of reflective areas RA in one sub-pixel SP can be integrally formed.

Figure 7B:
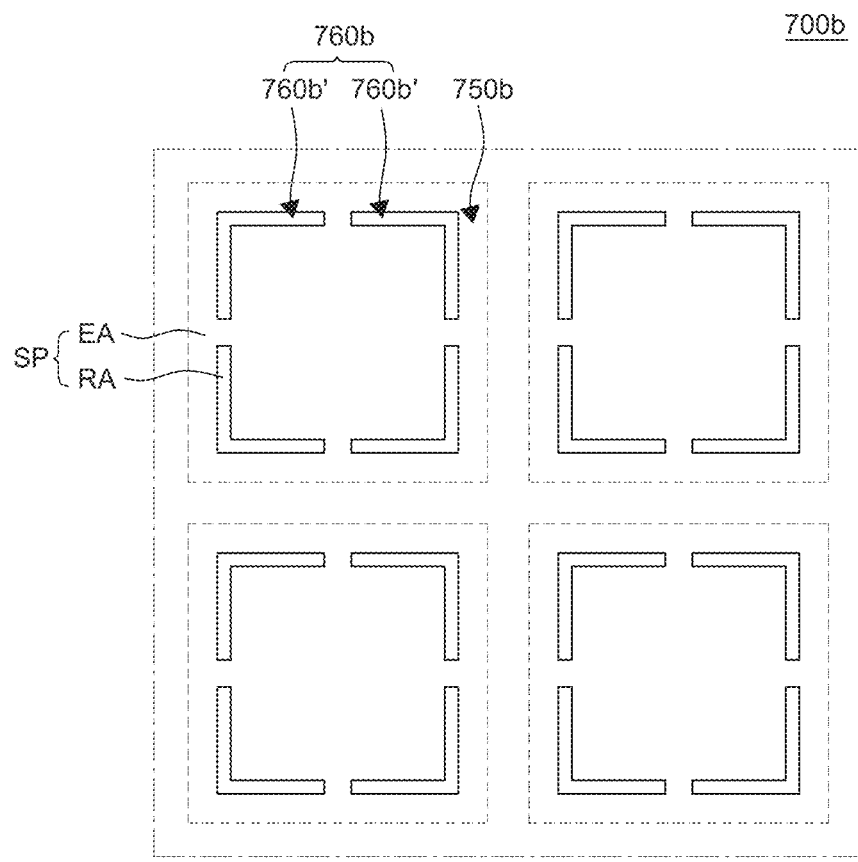
Figure 7C:
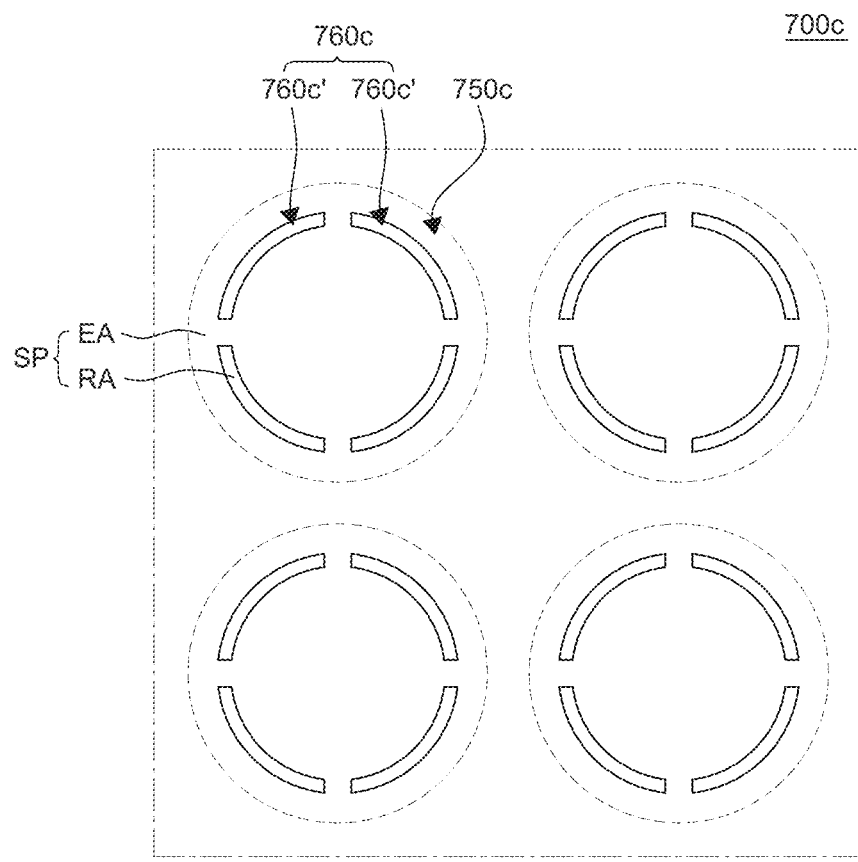

With reference to FIGS. 7B and 7C, one sub-pixel SP includes a plurality of reflective areas RA. A reflective part 760b can include a plurality of sub-reflective parts 760b' disposed on each of the reflective areas RA. A reflective part 760c can include a plurality of sub-reflective parts 760c' disposed on each of the reflective areas RA.

The plurality of reflective areas RA and the plurality of sub-reflective parts 760b' and 760c' can be disposed to have a shape corresponding to a planar shape of the sub-pixel SP (for example, a shape of the sub-pixel in a top view). The plurality of reflective areas RA and the plurality of sub-reflective part 760W and 760c' can be disposed along the side surface of the bank 170 having the opening portion 1700P for dividing the sub-pixels SP. The plurality of reflective areas RA and the plurality of sub-reflective parts 760b' and 760c' can be disposed to have a shape corresponding to a planar shape of the first electrode 151 exposed from the opening portion 1700P of the bank 170.

For example, the sub-pixel SP of FIG. 7B is formed in a rectangular shape, and the plurality of reflective areas RA and the plurality of sub-reflective parts 760b' can also be disposed in a rectangular shape. For example, the sub-pixel SP of FIG. 7C is formed in a circular shape, and the plurality of reflective areas RA and the plurality of sub-reflective parts 760c' can also be disposed in a circular shape.

Figure 7D:
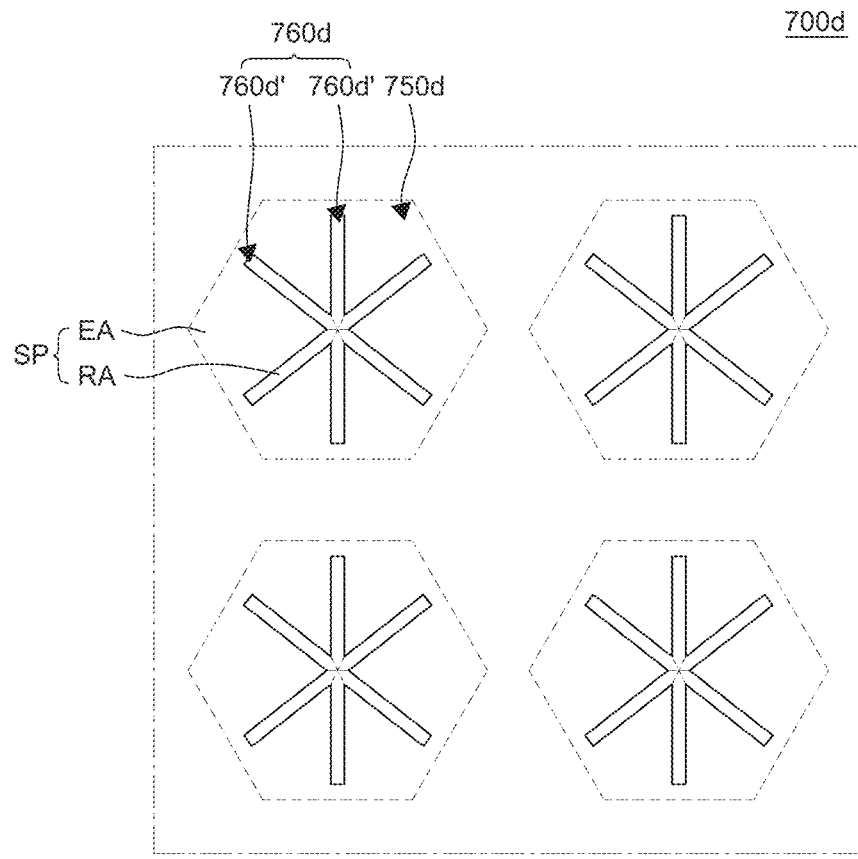
Figure 7E:
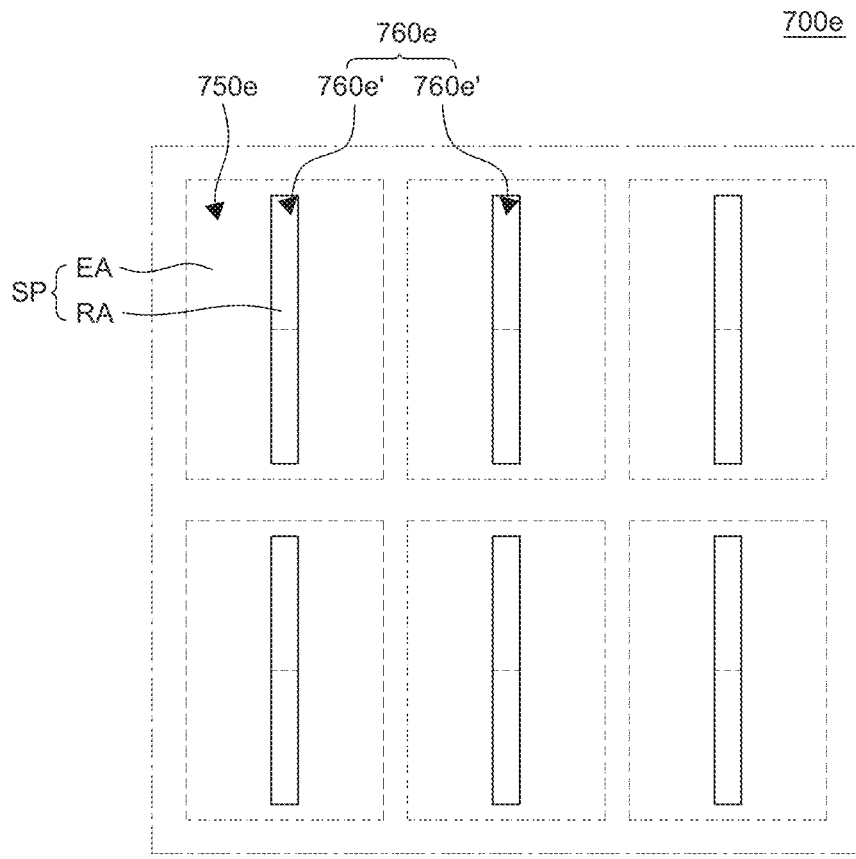

With reference to FIGS. 7D and 7E, one sub-pixel SP includes one reflective area RA and one light emitting area EA. For example, a plurality of sub-reflective parts 760d' and 760e' can be integrally formed and disposed on one reflective area RA.

Some portions of the plurality of sub-reflective parts 760d' and 760e' disposed on one reflective area RA can be in contact with one another, and some other portions thereof can be spaced apart from one another. For example, the sub-pixel SP of FIG. 7D can be formed in a hexagonal shape. As such, some portions (e.g., center portions) of the plurality of sub-reflective parts 760d' can be disposed in the center of the sub-pixel SP, and some other portions thereof (e.g., end portions) can be disposed toward six sides of the sub-pixel SP. Accordingly, a reflective part 760d comprised of the plurality of sub-reflective parts 760d' can be disposed to form an asterisk shape.

For example, the sub-pixel SP of FIG. 7E can be in a rectangular shape in which a vertical distance is greater than a horizontal distance. One portion of each of a plurality of sub-reflective parts 760e' can be disposed in the center of the sub-pixel SP, and the other portions thereof can be disposed toward the upper portion and the lower portion of the sub-pixel SP. Accordingly, a reflective part 760e formed of the plurality of sub-reflective part 760e' can be disposed to form a rod shape.

In the light emitting display apparatuses 700a, 700b, 700c, 700d, and 700e according to various embodiments of the present disclosure, the plurality of sub-reflective parts 760a', 760b', 760c', 760d', 760e' can be disposed in one sub-pixel SP to increase light reflected upwardly of the light emitting display apparatuses 700a, 700b, 700c, 700d, and 700e. As the plurality of sub-reflective parts 760a', 760b', 760c', 760d', and 760e' are disposed, a maximum distance needed for light emitted from light emitting elements 750a, 750b, 750c, 750d, and 750e to reach the reflective layer of the first electrode 151 and the reflective parts 760a, 760b, 760c, 760d, and 760e can be reduced. And, as the plurality of sub-reflective parts 760a', 760b', 760c', 760d', and 760e' are disposed, the probability that the light emitted from the light emitting elements 750a, 750b, 750c, 750d, and 750e is incident on the sub-reflective parts 760a', 760b', 760c', 760d', and 760e' can increase, and light reflected upwardly of the light emitting display apparatuses 700a, 700b, 700c, 700d, and 700e can increase. Accordingly, in the light emitting display apparatuses 700a, 700b, 700c, 700d, and 700e according to various embodiments of the present disclosure, the plurality of sub-reflective parts 760a', 760b', 760c', 760d', and 760e' having various shapes are disposed in the sub-pixels SP, whereby light extraction efficiency and front light extraction efficiency of the light emitting display apparatuses 700a, 700b, 700c, 700d, and 700e can be improved, and brightness of the light emitting display apparatuses 700a, 700b, 700c, 700d, and 700e can be enhanced.

Hereinafter, light emission efficiency will be described with reference to FIG. 8 and Table 2.

Figure 8:
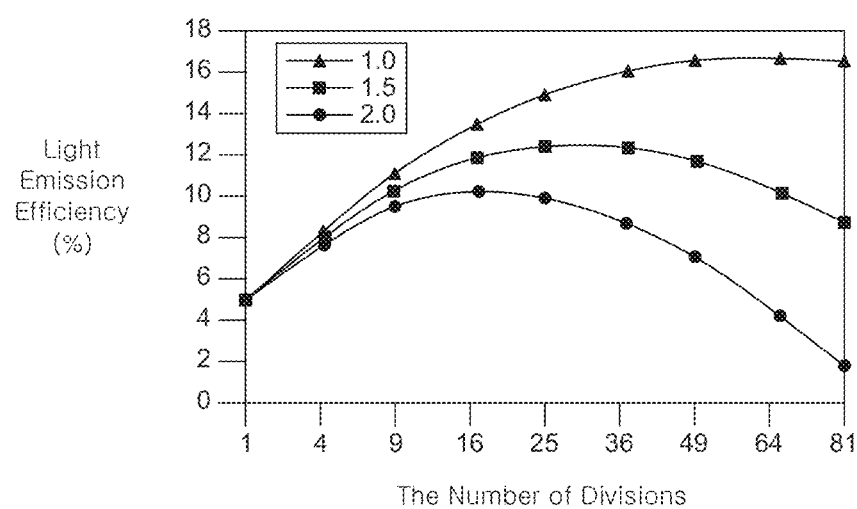
FIG. 8 is a graph showing light emission efficiency characteristics of the light emitting display apparatus according to various embodiments of the present disclosure.

FIG. 8 is a graph for showing light emission efficiency characteristics of the light emitting display apparatus according to various embodiments of the present disclosure.

FIG. 8 is a view illustrating a graph of Table 2 below. Hereinafter, FIG. 8 will be described with reference to Table 2. With regard to FIG. 8 and Table 2, in a structure of the light emitting display apparatus 500 of FIGS. 5A and 5B, by setting that the sub-pixel SP is formed as a shape of a square having a width of 20 μm and a length of 20 μm, the light emitting area EA having a square shape is divided by the number of divisions and thus, divided into square portions, and the reflective area RA is disposed between the divided light emitting areas EA to have a cross shape, light emission efficiency depending on the number of the plurality of light emitting areas EA and the height of the partition 140 was measured. For example, the partition 140 was set to have a shape of an equilateral triangle in a cross-section to measure light emission efficiency. In addition, in the light emitting display apparatus, it is necessary not to divide the light emitting area EA and to form the light emitting area EA integrally. However, in the simulation, even when the light emitting area EA is divided, each light emitting area EA can be set to emit light independently. Thus, for convenience of simulation, it was assumed that the light emitting area EA is divided.

TABLE 2

| | Height of Partition | The Number of Divisions | | | | | | | | |
|---|---|---|---|---|---|---|---|---|---|---|
| | (μm) | 1 | 4 | 9 | 16 | 25 | 36 | 49 | 64 | 81 |
| Light Emission Efficiency (%) | 1.0 | 4.9 | 8.4 | 11.1 | 13.3 | 14.9 | 16 | 16.6 | 16.8 | 16.6 |
| | 1.5 | 4.9 | 8.1 | 10.3 | 11.7 | 12.4 | 12.4 | 11.7 | 10.5 | 8.8 |
| | 2.0 | 4.9 | 7.8 | 9.5 | 10.2 | 9.9 | 8.9 | 7.1 | 4.7 | 1.8 |

The horizontal axis of FIG. 8 indicates the number of the light emitting areas EA divided by the reflective area RA disposed in a cross shape. For example, when the reflective area RA is not disposed, the number of divisions of the light emitting area EA is 1, and when one reflective area RA is disposed as shown in FIG. 2A, the number of divisions of the light emitting area EA is 4, and when the reflective area RA is disposed as shown in FIG. 7A, the number of divisions of the light emitting area EA is 9. The vertical axis of FIG. 8 indicates light emission efficiency of a square sub-pixel with width of 20 μm and length of 20 μm in which the protrusion portion 532 and the partition 140 are disposed, compared with a light emission efficiency of a square sub-pixel with width of 20 μm and length of 20 μm in which the protrusion portion 532 and the partition 140 are not disposed. The curves of FIG. 8 indicate an increase in light emission efficiency depending on the number of the light emitting areas EA divided and the height of the partition 140, and also indicates a decrease in light emission efficiency in consideration with the area of the light emitting area EA which is reduced due to the area of the reflective area RA which is a non-light emitting area that does not emit light.

With reference to FIG. 8, light emission efficiency can increase as the number of divisions of the light emitting area EA increases. For example, since a size of the divided light emitting areas EA is reduced and a maximum distance between the reflective areas RA disposed between the divided light emitting areas EA is reduced, a maximum movement distance of light emitted from the light emitting area EA until the light reaches the reflective area RA can be reduced. Therefore, as the size of the light emitting area EA decreases and the distance between the reflective areas RA decreases, light lost during movement in a lateral direction of the light emitting area EA can be reduced, and light extracted in the front direction of the light emitting display apparatus from the reflective area RA can increase. Therefore, light extraction efficiency and front light extraction efficiency can increase as the number of divisions of the light emitting area EA increases and the distance between the reflective areas RA decreases.

For example, when the reflective area RA is not disposed and thus, the number of divisions of the light emitting area EA is 1, light emission efficiency can be about 4.9%. In addition, as the number of divisions of the light emitting area EA increases, light emission efficiency can increase from 4.9%. For example, when the height of the partition 140 is 1.0 μm and the number of divisions of the light emitting area EA is 64, light emission efficiency can be 16.8% at the most. When the height of the partition 140 is 1.5 μm and the number of divisions is 25 and 36, light emission efficiency can be 12.4% at the most. When the height of the partition 140 is 2.0 μm and the number of divisions is 16, light emission efficiency can be 10.2% at the most.

Therefore, as the number of divisions of the light emitting area EA increases and the distance of the reflective area RA decreases, the maximum moving distance of the light until reaching the reflective area RA can decrease. Since at least a portion of light to be lost while traveling laterally of the light emitting element 550 can reach the reflective area RA and be extracted to the upper side of the light emitting display apparatus 500 before being lost, light emission efficiency can increase as shown in FIG. 8.

Next, light emission efficiency can vary based on the height of the partition 140 having a shape of an equilateral triangle in a cross-section. For example, as the height of the partition 140 increases, a width of the base side of the partition 140 that is an equilateral triangle can also increase. Accordingly, as the height of the partition 140 increases, the area of the reflective area RA in which the partition 140 is disposed can also increase, and the area of the reflective area RA which is a non-light emitting area in one sub-pixel SP can be increased. Therefore, when it is assumed that the number of divisions of the light emitting area EA is equal, in a case in which the height of the partition 140 is 1.0 μm, the area of the reflective area RA can be the smallest, and in a case in which the height of the partition 140 is 2.0 μm, the area of the reflective area RA can be the largest.

When the height of the partition 140 is 1.0 μm, light emission efficiency can increase until the number of light emitting areas EA divided by the reflective area RA is 64. When the height of the partition 140 is 1.5 μm, light emission efficiency can increase until the number of light emitting areas EA divided by the reflective area RA is 36. When the height of the partition 140 is 2.0 μm, light emission efficiency can increase until the number of light emitting areas EA divided by the reflective area RA is 16.

As the height of the partition 140 increases, the area of the reflective area RA in which the partition 140 is disposed also increases, thereby increasing the probability that light to be lost laterally of the light emitting element 550 is reflected to the upper portion of the light emitting display apparatus 500.

As the height of the partition 140 increases, or as the number of light emitting areas EA divided by the reflective area RA increases, the area of the light emitting area EA decreases, thereby lowering light emission efficiency. The reflective part 560 of the reflective area RA is formed of the same material as the light emitting element 550, but only reflects light and does not emit light. Therefore, in the sub-pixel SP, the reflective area RA in which the reflective part 560 is disposed, can be a non-light emitting area that does not emit light.

Therefore, as the area of the reflective area RA in the sub-pixel SP having a predetermined area increases, the area of the light emitting area EA can decrease. When the area of the light emitting area EA is reduced by the reflective area RA, the amount of light emitted from the light emitting element 550 itself can be reduced. In addition, since the area of the sub-pixel SP is in the unit of μm, it can be difficult to form a predetermined number or more of the reflective areas RA in a limited area.

Therefore, the arrangement of the reflective area RA can be configured in consideration of the area of the light emitting area EA and process efficiency. For example, in the case of the sub-pixel SP formed in a shape of a square having a width of 20 μm and a length of 20 μm, when the number of the light emitting areas EA divided by the reflective area RA is 4 to 49, light emission efficiency can be optimized.

In the light emitting display apparatuses 100, 500, 600b, 600c, 700a, 700b, 700c, 700d, and 700e according to various embodiments of the present disclosure, light emission efficiency can be optimized in consideration of some or all of the following factors: the height of the partition 140, 640b, and 640c, the area of the reflective area RA (or the area of the plurality of sub-reflective parts), the number of the light emitting areas EA divided by the reflective area RA (or by the plurality of sub-reflective parts), for example, the number of divisions of the light emitting area EA, and the area of the sub-pixel SP. First, as the height of the partition 140, 640b, and 640c increases, the maximum width of the partition 140, 640b, and 640c also increases, so that the area of the reflective area RA in which the partition 140, 640b, and 640c is disposed can also increase. Therefore, as the height of the partition 140, 640b, and 640c increases, the amount of light capable of being incident on the reflective area RA can increase, and light extracted to the upper sides of the light emitting display apparatuses 100, 500, 600b, 600c, 700a, 700b, 700c, 700d, and 700e can also increase. As the height of the partition 140, 640b, and 640c increases, the area of the reflective area RA, which is a non-light emitting area that does not emit light, can be excessively widened, so that the area of the light emitting area EA decreases to thereby lead to a decrease in the amount of light emitted from the light emitting area EA. Therefore, in the light emitting display apparatuses 100, 500, 600b, 600c, 700a, 700b, 700c, 700d, and 700e according to various embodiments of the present disclosure, light emission efficiency can be optimized in consideration of the height of the partition 140, 640b, and 640c and the area of the reflective area RA.

Next, as the number of the light emitting areas EA divided by the reflective area RA increases, the maximum distance between the reflective areas RA can decrease, and the light lost while moving toward the reflective area RA can also decrease. In addition, as the number of the light emitting areas EA divided by the reflective area RA increases, the amount of light capable of being incident on the reflective area RA can increase, and the light extracted to the upper sides of the light emitting display apparatuses 100, 500, 600b, 600c, 700a, 700b, 700c, 700d, and 700e can also increase. As the number of divisions of the light emitting area EA by the reflective area RA increases, the area of the reflective area RA can also increase. Therefore, when a plurality of reflective areas RA are excessively disposed, and the area of the reflective areas RA which are non-light emitting areas increases, the area of the light emitting area EA is reduced to result in a decrease in the amount of light emitted from the light emitting area EA. In addition, the size of the sub-pixel SP can decrease as the resolution is higher. Therefore, in the sub-pixel SP having a very small size, it can be difficult to configure the number of the light emitting areas EA divided by the reflective area RA, to a predetermined number or more. For example, when the size of the sub-pixel SP is in the unit of μm, the distance between the reflective areas RA can also be in the unit of μm. However, considering process efficiency, it can be difficult to configure the distance between the reflective areas RA to a predetermined level or less. Accordingly, in the light emitting display apparatuses 100, 500, 600b, 600c, 700a, 700b, 700c, 700d, and 700e according to various embodiments of the present disclosure, light emitting efficiency can be optimized in consideration of the number of divisions of the light emitting area EA by the reflective area RA, the distance between the reflective areas RA and the area of the sub-pixel SP.

The light emitting display apparatus according to one or more embodiments of the present disclosure will be described below.

For example, a light emitting display apparatus according to an embodiment of the present disclosure includes a substrate including a plurality of sub-pixels, each of the plurality of sub-pixels including a light emitting area and a reflective area surrounded by the light emitting area, an overcoating layer on the substrate, a partition at the reflective area on the overcoating layer, a light emitting element at the light emitting area on the overcoating layer, and a reflective part on the partition and formed of a same material as the light emitting element.

According to some embodiments of the present disclosure, the light emitting element can include a first electrode including a reflective layer, a light emitting layer on the first electrode, and a second electrode on the light emitting layer. The reflective part can include a first layer formed of a same material as the first electrode, a second layer formed of the same material as the light emitting layer and disposed on the first layer, and a third layer formed of a same material as the second electrode and on the second layer.

According to some embodiments of the present disclosure, at least a portion of the light emitting element can be insulated from at least a portion of the reflective part.

According to some embodiments of the present disclosure, the second electrode can be spaced apart from the third layer.

According to some embodiments of the present disclosure, the light emitting layer can be spaced apart from the second layer.

According to some embodiments of the present disclosure, the light emitting display apparatus can further include a bank on the first electrode and including an opening portion exposing a portion of the first electrode. The partition and the reflective part can be disposed in the opening portion and are spaced apart from the bank.

According to some embodiments of the present disclosure, the overcoating layer can include a base portion between the substrate and the light emitting element, and a protrusion portion between the base portion and the light emitting element. The first electrode can extend from the base portion toward an upper surface of the protrusion portion, and the bank can cover the protrusion portion.

According to some embodiments of the present disclosure, a height of the partition can be lower than or equal to a height of the protrusion portion.

According to some embodiments of the present disclosure, the reflective area can be disposed in plural at at least one sub-pixel among the plurality of sub-pixels. The light emitting area can be integrally provided in all of the plurality of sub-pixels.

According to some embodiments of the present disclosure, the partition can be integrally provided with the overcoating layer.

According to some embodiments of the present disclosure, an inclination of the partition can be approximately 60 degrees or more.

A light emitting display apparatus according to an embodiment of the present disclosure includes an overcoating layer on a substrate, a partition on the overcoating layer, a light emitting element including a first electrode on the overcoating layer, and a reflective part including a first layer on the partition. The light emitting element is disposed to surround the reflective part, and some of light emitted from the light emitting element is reflected upwardly of the light emitting element by the reflective part to extract light to be lost laterally of the light emitting element.

According to some embodiments of the present disclosure, the first electrode and the first layer can include a same reflective material.

According to some embodiments of the present disclosure, the light emitting display apparatus can further include a bank covering a periphery portion of the first electrode. The bank can be disposed to surround the reflective part.

According to some embodiments of the present disclosure, the reflective part can include a plurality of sub-reflective parts along a side surface of the bank. The first electrode can be between the plurality of sub-reflective parts.

According to some embodiments of the present disclosure, the plurality of sub-reflective parts can be disposed to have a shape corresponding to a planar shape of a portion of the first electrode that is exposed from the bank, and the plurality of sub-reflective parts can be spaced apart from each other.

According to some embodiments of the present disclosure, the reflective part can include a plurality of sub-reflective parts, some portions of the plurality of sub-reflective parts are in contact with each other, and some other portions of the plurality of sub-reflective parts are spaced apart from each other. The first electrode can be between the plurality of sub-reflective parts.

According to some embodiments of the present disclosure, a planar shape of the plurality of sub-reflective parts can be one among a bar shape, a cross shape, and an asterisk shape.

According to some embodiments of the present disclosure, the light emission efficiency of the light emitting display apparatus can be optimized by adjusting one or more of: the number of divisions obtained through dividing the light emitting element by the plurality of sub-reflective parts, a distance between two adjacent ones of the plurality of sub-reflective parts, a height of the partition, and/or an area of the plurality of sub-reflective parts.

According to some embodiments of the present disclosure, at least a portion of the light emitting element and at least a portion of the reflective part can be electrically separated from each other.

According to some embodiments of the present disclosure, the light emitting element can further include a second electrode on the first electrode. The reflective part can further include a third layer on the first layer. The second electrode and the third layer can be electrically insulated from each other.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:

1. A light emitting display apparatus, comprising:
a substrate including a plurality of sub-pixels, each of the plurality of sub-pixels including a light emitting area and a reflective area surrounded by the light emitting area;
an overcoating layer on the substrate;
a partition at the reflective area on the overcoating layer;
a light emitting element at the light emitting area on the overcoating layer; and
a reflective part on the partition and formed of a same material as the light emitting element,
wherein the light emitting element includes:
a first electrode including a reflective layer;
a light emitting layer on the first electrode; and
a second electrode on the light emitting layer,
wherein the reflective part includes:
a first layer formed of a same material as the first electrode;
a second layer formed of a same material as the light emitting layer and disposed on the first layer; and
a third layer formed of a same material as the second electrode and disposed on the second layer, and
wherein the second electrode is spaced apart from the third layer so that the second electrode of the light emitting element is insulated from the third layer of the reflective part.

2. The light emitting display apparatus of claim 1, wherein the light emitting layer is spaced apart from the second layer so that the light emitting layer is insulated from the second layer.

3. The light emitting display apparatus of claim 1, further comprising a bank on the first electrode and including an opening portion exposing a portion of the first electrode,
wherein the partition and the reflective part are disposed at the opening portion and are spaced apart from the bank.

4. The light emitting display apparatus of claim 3, wherein the overcoating layer includes:
a base portion between the substrate and the light emitting element; and
a protrusion portion between the base portion and the light emitting element,
wherein the first electrode extends from the base portion toward an upper surface of the protrusion portion, and the bank covers the protrusion portion.

5. The light emitting display apparatus of claim 4, wherein a height of the partition is lower than or equal to a height of the protrusion portion.

6. The light emitting display apparatus of claim 1, wherein the reflective area is disposed in plural at least one sub-pixel among the plurality of sub-pixels, and
the light emitting area is integrally provided in all of the plurality of sub-pixels.

7. The light emitting display apparatus of claim 1, wherein the partition is integrally provided with the overcoating layer.

8. The light emitting display apparatus of claim 1, wherein an inclination of the partition is approximately 60 degrees or more.

9. A light emitting display apparatus, comprising:
an overcoating layer on a substrate;
a partition on the overcoating layer;
a light emitting element on the overcoating layer; and
a reflective part on the partition,
wherein the light emitting element is disposed to surround the reflective part,
some of light emitted from the light emitting element is reflected upwardly of the light emitting element by the reflective part to extract light to be lost laterally of the light emitting element,
wherein the light emitting element includes:
a first electrode including a reflective layer;
a light emitting layer on the first electrode; and
a second electrode on the light emitting layer,
wherein the reflective part includes:
a first layer formed of a same material as the first electrode;
a second layer formed of a same material as the light emitting layer and disposed on the first layer; and
a third layer formed of a same material as the second electrode and disposed on the second layer, and
wherein the second electrode is spaced apart from the third layer so that the second electrode is insulated from the third layer.

10. The light emitting display apparatus of claim 9, wherein the first electrode and the first layer include a same reflective material.

11. The light emitting display apparatus of claim 9, further comprising a bank covering a periphery portion of the first electrode,
wherein the bank is disposed to surround the reflective part.

12. The light emitting display apparatus of claim 11, wherein the reflective part includes a plurality of sub-reflective parts along a side surface of the bank, and
wherein the first electrode is between the plurality of sub-reflective parts.

13. The light emitting display apparatus of claim 12, wherein the plurality of sub-reflective parts are disposed to have a shape corresponding to a planar shape of a portion of the first electrode that is exposed from the bank, and
the plurality of sub-reflective parts are spaced apart from each other.

14. The light emitting display apparatus of claim 11, wherein the reflective part includes a plurality of sub-reflective parts, some portions of the plurality of sub-reflective parts are in contact with each other, and some other portions of the plurality of sub-reflective parts are spaced apart from each other, and
wherein the first electrode is between the plurality of sub-reflective parts.

15. The light emitting display apparatus of claim 14, wherein a planar shape of the plurality of sub-reflective parts is one among a bar shape, a cross shape, and an asterisk shape.

16. The light emitting display apparatus of claim 12, wherein light emission efficiency of the light emitting display apparatus is optimized by adjusting one or more of:
the number of divisions obtained through dividing the light emitting element by the plurality of sub-reflective parts,
a distance between two adjacent ones of the plurality of sub-reflective parts,
a height of the partition, and
an area of the plurality of sub-reflective parts.

17. The light emitting display apparatus of claim 14, wherein light emission efficiency of the light emitting display apparatus is optimized by adjusting one or more of:
- the number of divisions obtained through dividing the light emitting element by the plurality of sub-reflective parts,
- a distance between two adjacent ones of the plurality of sub-reflective parts,
- a height of the partition, and
- an area of the plurality of sub-reflective parts.

\* \* \* \* \*